United States Patent
Shiraishi

(10) Patent No.: US 6,421,123 B1
(45) Date of Patent: *Jul. 16, 2002

(54) POSITION DETECTING APPARATUS

(75) Inventor: Naomasa Shiraishi, Saitama-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/224,359

(22) Filed: Jan. 4, 1999

Related U.S. Application Data

(60) Continuation of application No. 08/937,523, filed on Sep. 25, 1997, now Pat. No. 5,903,356, which is a division of application No. 08/639,099, filed on Apr. 26, 1996, now Pat. No. 5,706,091.

(30) Foreign Application Priority Data

| Feb. 6, 1995 | (JP) | ............................................. 7-136783 |
| Apr. 28, 1995 | (JP) | ............................................. 7-106556 |

(51) Int. Cl.[7] .............................................. G01B 11/00

(52) U.S. Cl. ........................ 356/399; 356/400; 356/401

(58) Field of Search ................................. 356/399, 400, 356/401

(56) References Cited

U.S. PATENT DOCUMENTS 5,140,366 A    8/1992  Shiozawa et al. .............. 355/53
5,903,356 A  * 5/1999  Shiraishi ...................... 356/399

FOREIGN PATENT DOCUMENTS

JP            3-27515         2/1991

\* cited by examiner

*Primary Examiner*—Frank G. Font
*Assistant Examiner*—Andrew H. Lee
(74) *Attorney, Agent, or Firm*—Armstrong, Westerman & Hattori, LLP

(57) ABSTRACT

Illuminating light at a pupil plane of an illumination optical system for illuminating a position detection mark on a substrate is limited to an annular area centered at an optical axis, and a member substantially blocks an image-forming light beam distributed over an area on a pupil plane of an image-forming optical system for forming an image of the position detection mark on an imaging device by receiving light generated from the mark, the area being in image-forming relation to the annular area on the pupil plane of the illumination optical system. Alternatively, a member gives a phase difference of approximately π/2 [rad] between the image-forming light beam distributed over the area which is in image-forming relation to the annular area on the pupil lane of the illumination optical system and the image-forming light beam distributed over the area other than that area. The outer radius $r_o$ and inner radius $r_i$ of the annular area on the pupil plane of the illumination optical system are determined so as to satisfy the following conditions:

$$r_i \geq \lambda 2/(2 \times P) \quad r_o - r_i \leq \lambda 1/P$$

where λ1 is the shortest wavelength in the wave band of illuminating light contributing to the formation of an image signal, λ2 is the longest wavelength in the wave band, and P is the period of the position detection mark.

10 Claims, 23 Drawing Sheets

POSITION DETECTING APPARATUS

This application is a continuation of Ser. No. 08/937,523 filed Sep. 25, 1997 now U.S. Pat. No. 5,903,356 which is a divisional of Ser. No. 08/639,099 filed Apr. 26, 1996 now U.S. Pat. No. 5,706,091.

BACKGROUND OF THE INVENTION

The present invention relates to a technique of aligning a mask pattern and a photosensitive substrate relative to each other, which is applicable to an exposure system used in a photolithography process in which a mask pattern is transferred onto a photosensitive substrate to produce semiconductor devices, for example. More particularly, the present invention relates to a technique of detecting a mask pattern provided on a photosensitive substrate.

In photolithography processes for producing, for example, semiconductor devices, liquid crystal display devices, thin-film magnetic heads, imaging devices (CCD), magneto-optical discs, etc., an exposure system is used in which an image of a transfer pattern formed on a photo-mask or reticle (hereinafter referred to collectively as "reticle") is transferred onto a photosensitive substrate, e.g., a wafer or glass plate coated with a photoresist, by a projection exposure method through a projection optical system, or by a proximity exposure method.

In such an exposure system, the reticle and the wafer must be aligned with respect to each other with high accuracy prior to the exposure process. In order to effect the alignment, the wafer has position detecting marks (alignment marks) formed (transferred by exposure) thereon in a previous processing step. By detecting the positions of the alignment marks, the position of the wafer (i.e., the circuit pattern on the wafer) can be accurately detected.

Examples of alignment mark detecting methods include a laser beam scan type detecting method, a laser interference type detecting method, etc., in which the position of an alignment mark is detected by detecting laser light scattered or diffracted by the mark. However, laser light has strong monochromatic properties; therefore, the use of laser light may cause position detection accuracy to be degraded on account of adverse effects such as multiple interference between the photoresist surface and the mark surface.

There is another position detecting method in which an alignment mark is illuminated by a broad-band light beam from a light source, e.g., a lamp, and the illuminated mark is imaged through an image-forming optical system to detect the position of the alignment mark on the basis of an image signal output from the image-forming optical system (this type of detection method will be hereinafter referred to as "imaging type position detection"). In contrast to the above-described detection methods that use laser light, the imaging type position detection has a merit that the position detection is unlikely to be influenced by adverse effects such as the presence of the photoresist.

Under the present circumstances where the patterns of semiconductor integrated circuits and other similar devices become increasingly finer, a process of planarizing (i.e., leveling) the wafer surface has recently been introduced as a process carried out after a film deposition process and before a photolithography process. The planarization process has an effect of improving device characteristics by uniformizing the thickness of a deposited film from which a circuit pattern is to be formed, and also has an effect of improving the adverse effects on the wafer surface unevenness on the line width error of a transferred pattern during the photolithography process.

However, in a detection system where position detection is effected on the basis of a height difference between the recessed and projecting portions of an alignment mark or a reflectivity variation at the alignment mark portion on the wafer surface, the planarization process may make it impossible to detect an alignment mark because the height difference between the recessed and projecting portions of the alignment mark is considerably reduced by the planarization. Particularly, in a process for an opaque deposited film (i.e., a metal or semiconductor film), the alignment marks are covered with an opaque film of uniform reflectivity. Therefore, position detection depends only on the height difference between the recessed and projecting portions of the marks. Thus, planarization carried out for an opaque deposited film raises the most serious problem.

Incidentally, "dark-field microscopes" and "phase-contrast microscopes" are known as optical systems for detecting only a "step" portion on a substantially flat object to be detected. One type of dark-field microscope is arranged such that an object to be detected is illuminated with a numerical aperture large enough to prevent direct light from entering the image-forming optical system, and an image is formed through the image-forming optical system by using only light scattered by the object. In another type of dark-field microscope, a circular light-blocking member is provided at a part of an optical Fourier transform plane (pupil plane) in the image-forming optical system with respect to the object to be detected such that the center of the circular light-blocking member coincides with the optical axis of the image-forming optical system, and an aperture stop (o stop) is provided by which the distribution of illuminating light over a plane in the illumination optical system which is conjugate with the light-blocking member, that is, an optical Fourier transform plane in the illumination optical system with respect to the object to be detected, is restricted within a circle which is in image-forming relation to the circular light-blocking member. As the aperture stop (o stop), a stop having an annular aperture may be employed.

A typical dark-field microscope is adapted to apply illuminating light to an object to be detected (e.g., a position detection mark on a wafer) and to form an image of only higher-order diffracted light (and scattered light), with zeroth-order diffracted light (regularly reflected light) being blocked, among light reflected and diffracted by the illuminated object. Among the diffracted light, zeroth-order diffracted light contains substantially no information concerning unevenness on the object or reflectivity variation of the object. However, higher-order (first- and higher-order) diffracted light contains such information. Therefore, the dark-field microscope enables steps to be made visible more clearly (with higher contrast) than the ordinary (bright-field) microscopes because the image is formed only from higher-order diffracted light with zeroth-order diffracted light being blocked.

Meanwhile, a typical phase-contrast microscope has a phase-contrast filter provided at a pupil plane of an image-forming optical system. The phase-contrast filter gives a phase difference between zeroth-order diffracted light and diffracted (and scattered) light of other orders. The quantity of higher-order (first- and higher-order) diffracted light generated from a mark pattern of low step is extremely small. However, in the phase-contrast microscope, zeroth-order diffracted light, which is generated in a large quantity, can also be contributed to image formation. Therefore, it is possible to obtain an image which is brighter (higher in light intensity) than in the case of the dark-field microscope. It should be noted that, when the intensity ratio of zeroth-order diffracted light to diffracted light of other orders is extremely high, the image contrast reduces, and therefore, zeroth-order diffracted light may be reduced under certain circumstances.

However, if the conventional dark-field microscope is used to detect a position detection mark on a wafer, not only zeroth-order diffracted light, which is not needed for image formation, but also diffracted light of relatively low order (i.e., useful diffracted light, which contributes to image formation) is blocked, causing the image contract and fidelity to be degraded.

In a case where a conventional phase-contrast microscope is used to detect a position detection mark on a wafer, not only zeroth-order diffracted light, which is not needed for image formation, but also diffracted light of other orders (i.e., useful diffracted light, which contributes to image formation) is subjected to phase-difference imparting action and light-reducing action, causing the image contrast and fidelity to be degraded.

In view of the above-described problems, an object of the present invention is to provide an position detecting apparatus which is capable of accurately and reliably detecting the position of a position detection mark, even a mark having an extremely small height difference (step) between recessed and projecting portions which constitute the mark.

SUMMARY OF THE INVENTION

The present invention is applied to an apparatus having: an illumination optical system for illuminating a position detection mark on a substrate by illuminating light (e.g., broad-band light or multi-wavelength light) in a predetermined wave band; an image-forming optical system for forming an image of the position detection mark on an imaging device by receiving light generated from the position detection mark; and an image processing system for calculating the position of the position detection mark on the basis of an image signal output from the imaging device. In the present invention, the apparatus is provided with an illuminating light beam limiting member for limiting the illuminating light beam at a first plane (pupil plane) in the illumination optical system which is practically in optical Foureir transform relation to the position detection mark so that the illuminating light beam passes through only a substantially annular first area on the first plane which is centered at an optical axis of the illumination optical system; and an image-forming light beam limiting member for substantially blocking the image-forming light beam distributed over a substantially annular second area on a second plane (pupil plane) in the image-forming optical system which second plane is practically in optical Foureir transform relation to the position detection mark, the second area being in image-forming relation to the first area.

In the present invention, the apparatus may be provided with the above-described illuminating light beam limiting member, and a light-block member for selectively blocking light distributed over the second plane in the image-forming optical system such that the light-blocking member substantially blocks light regularly reflected by a position detection mark having periodicity as it is illuminated with the illuminating light beam, but transmits only light reflected and diffracted by the mark. Alternatively, the apparatus may be provided with, in place of the above-described illuminating light beam limiting member, an optical member for controlling the intensity distribution of the illuminating light over the first plane in the illumination optical system such that the intensity of the illuminating light in an annular first area on the first plane is higher than in another area on the first plane, and the above-described image-forming light beam limiting member. The above-described illuminating light beam limiting member and image-forming light beam limiting member may be replaced by, respectively, a first stop member for passing an illuminating light beam distributed over an annular first area on a practical pupil plane of the illumination optical system, and a second stop member for passing an image-forming light beam distributed over an area other than an annular second area on a practical pupil plane of the image-forming optical system.

In the above-described arrangement, the substantially annular first area may be replaced by a first area having another predetermined shape, and the substantially annular second area may be replaced by a second area having a shape corresponding to the predetermined shape and being in image-forming relation to the first area.

It is desirable that the outer radius $r_o$ and inner radius $r_i$ of the annular first area should satisfy the following conditions:

$$r_i \geq \lambda 2/(2 \times P)$$

$$r_o - r_i \leq \lambda 1/P$$

where $\lambda 1$ is the shortest wavelength in the wave band of light beams contributing to the formation of the image signal in the illuminating light, $\lambda 2$ is the longest wavelength in the wave band, and P is the period of the position detection mark.

It is desirable that the numerical aperture $NA_o$ of the image-forming optical system should satisfy the following condition:

$$NA_o \geq r_o + \lambda 2/P$$

It is preferable to provide a member for retaining the image-forming light beam limiting member (or the light-blocking member or the second stop member) in such a manner that the image-forming light beam limiting member can be selectively inserted into and withdrawn from the optical path of the image-forming optical system. In such a case, it is preferable to further provide a member for retaining the illuminating light beam limiting member (or the optical member or the first stop member) in such a manner that the illuminating light beam limiting member can be selectively inserted into and withdrawn from the optical path of the illumination optical system.

The apparatus may be further provided with an image forming device for forming an image of an index mark on the imaging device, so that a positional displacement between the image of the position detection mark and the image of the index mark is detected on the basis of an image signal output from the imaging device. It is desirable for the image forming device to have: an index board having the index mark; an illumination system for illuminating the index board by a light beam different from the illuminating light applied to the substrate surface; and an image-forming system for forming an image of the index mark on the imaging device by receiving light generated from the index mark. Particularly, the index board may be placed at a plane in the image-forming optical system which is practically conjugate to the substrate, so that the image-forming optical system forms an image of the position detection mark on the index board and also forms an image of the position detection mark and an image of the index mark on the imaging device.

The optical member for controlling the intensity distribution of the illuminating light over the first plane in the illumination optical system such that the intensity of the illuminating light in a first area having an annular or other predetermined shape on the first plane is higher than in another area on the first plane may be a stop member with a light-blocking portion which substantially covers the another area on the first plane so that the light intensity in the another area is substantially zero.

It is desirable for the optical member to have an intensity distribution changing member for change at least one of the outer and inner radii of the annular first area. The intensity distribution changing member may have a plurality of stop members which are different from each other in at least one of the outer and inner radii of an annular aperture, and a member for retaining the stop members such that one of the stop members is placed in the optical path of the illumination optical system. It is desirable for the image-forming light beam limiting member to change the radial width of a light-blocking portion which substantially covers the annular second area in accordance with a change of at least one of the outer and inner radii of the first area.

According to another aspect thereof, the present invention is applied to an apparatus having: an illumination optical system for illuminating a position detection mark on a substrate by illuminating light (e.g., board-band light or multi-wavelength light) in a predetermined wave band; an image-forming optical system for forming an image of the position detection mark on an imaging device by receiving light generated from the position detection mark; and an image processing system for calculating the position of the position detection mark on the basis of an image signal output from the imaging device.

In the present invention, the apparatus sis provided with an illuminating light beam limiting member for limiting the illuminating light beam at a first plane (pupil plane) in the illumination optical system which is practically in optical Foureir transform relation to the position detection mark so that the illuminating light beam passes through only a substantially annular first area on the first plane which is centered at an optical axis of the illumination optical system, and a phase-contrast member for giving a phase difference between an image-forming light beam distributed over a substantially annular second area on a second plane (pupil plane) in the image-forming optical system which second plane is practically in optical Fourier transform relation to the position detection mark, the second area being in image-forming relation to the first area, and an image-forming light beam distributed over an area on the second plane other than the second area.

Alternatively, the apparatus may be provided with an illuminating light beam limiting member for limiting the illuminating light beam at the first plane in the illumination optical system so that the illuminating light beam passes through only a substantially annular first area on the first plane which is centered at the optical axis of the illumination topical system, and a phase-contrast member for giving a phase difference to light distributed over the second plane in the image-forming optical system such that light regularly reflected by the position detection mark as illuminated by the illuminating light beam is different in phase from light other than the regularly reflected light.

The apparatus may be provided with an optical member for controlling the intensity distribution of the illuminating light or secondary light source (surface illuminant) over the first plane in the illumination optical system such that the intensity of the illuminating light in the substantially annular first area is higher than in another area on the first plane, and a phase-contrast member for giving a phase difference between the image-forming light beam distributed over a substantially annular second area on the second plane in the image-forming optical system, which second area is in image-forming relation to the first area, and the image-forming light beam distributed over an area on the second plane other than the second area.

The apparatus may be provided with a stop member for passing the illuminating light beam distributed over an annular first area on a practical pupil plane of the illumination optical system, and a phase-contrast member for giving a phase difference between the image-forming light beam distributed over a substantially annular second area on the second plane in the image-forming optical system, which second area is in image-forming relation to the first area, and the image-forming light beam distributed over an area other than the second area.

The apparatus may be provided with a member for forming a substantially annular secondary light source on a practical pupil plane of the illumination optical system, the secondary light source being centered at the optical axis of the illumination optical system (or a member for forming a plurality of light source images in a substantially annular area on the pupil plane which is centered at the optical axis), and a phase-contrast member for giving a phase difference between the image-forming light beam distributed over a substantially annular area on a practical pupil plane of the image-forming optical system, which substantially annular area is in image-forming relation to the secondary light source, and the image-forming light beam distributed over an area on the practical pupil plane other than the substantially annular area.

The apparatus may be provided with an optical member for controlling the light intensity distribution over a practical pupil plane of the illumination optical system such that the light intensity in a substantially annular area which is centered at the optical axis of the illumination optical system is higher than in an area on the practical pupil plane inside the substantially annular area, and a phase-contrast member for giving a phase difference between the image-forming light beam distributed over a substantially circular area on a practical pupil plane of the image-forming optical system, which substantially circular area is in image-forming relation to the inside area, and the image-forming light beam distributed over an area on the practical pupil plane other than the substantially circular area.

In the above-described arrangement, the substantially annular first area may be replaced by a first area having another predetermined shape, and the substantially annular second area may be replaced by a second area having a shape corresponding to the predetermined shape and being in image-forming relation to the first area.

It is desirable for the apparatus to have a member for reducing the image-forming light beam distributed over the annular area on the second plane in the image-forming optical system, that is, zeroth-order light distributed over the second plane. The light-reducing member may be integrally formed with the phase-contrast member, or it may be disposed in close proximity to the phase-contrast member or placed at a plane approximately conjugate to the phase-contrast member (i.e., pupil conjugate plane).

It is desirable for the phase-contrast member to give a phase difference of approximately $(2m+1)\pi/2\pm\pi/4$ [rad] (m is an integer) between the image-forming light beam distributed over the second area and the image-forming light beam distributed over the area other than the second area. In this case, it is possible to shift either the phase of the image-forming light beam distributed over the second area or the phase of the image-forming light beam distributed over the area other than the second area. It is also possible to shift both the light beams by different amounts so that the above-described phase difference is given between them.

It is desirable that the outer radius $r_o$ and inner radius $r_i$ of the annular first area should satisfy the following conditions:

$$r_i \geq \lambda 2/(2 \times P)$$

$$r_o - r_i \leq \lambda 1/P$$

where $\lambda 1$ is the shortest wavelength in the wave band of light beams contributing to the formation of the image signal in the illuminating light, $\lambda 2$ is the longest wavelength in the wave band, and P is the period of the position detection mark.

It is desirable that the numerical aperture $NA_o$ of the image-forming optical system should satisfy the following condition:

$$NA_o \geq r_o + \lambda 2/P$$

It is preferable to provide a member for retaining the phase-contrast member in such a manner that the phase-contrast member can be selectively inserted into and withdrawn from the optical path of the image-forming optical system. In this case, it is preferable to further provide a member for retaining the illuminating light beam limiting member [or the optical member, the stop member or the secondary light source (light source image) forming member] in such a manner that the illuminating light beam limiting member can be selectively inserted into and withdrawn from the optical path of the illumination optical system.

The apparatus may be further provided with an image forming device for forming an image of an index mark on the imaging device, so that a positional displacement between the image of the position detection mark and the image of the index mark is detected on the basis of an image signal output from the imaging device. It is desirable for the image forming device to have: an index board having the index mark; an illumination system for illuminating the index board by a light beam different from the illuminating light applied to the substrate surface; and an image-forming system for forming an image of the index mark on the imaging device by receiving light generated from the index mark. Particularly, the index board may be placed at a plane in the image-forming optical system which is practically conjugate to the substrate, so that the image-forming optical system forms an image of the position detection mark on the index board and also forms an image of the position detection mark and an image of the index mark on the imaging device.

Further, it is desirable to provide a member for adjusting the intensity of the light beam illuminating the index mark in accordance with a change in light quantity of the image-forming light beam from the position detection mark which is incident on the imaging device due, for example, to insertion or withdrawal of the illuminating light beam limiting member (or the optical member, etc.) into or from the optical path of the illumination optical system or replacement of the illuminating light beam limiting member. For example, the intensity of the light beam is increased in response to the withdrawal of the illuminating light beam limiting member from the illumination optical path. The adjusting member may be adapted to change the electric power (current or voltage) supplied to a light source that emits the light beam. Alternatively, the adjusting member may comprise a plurality of light-reducing filters which are different in transmittance from each other, and which are interchangeably disposed in the beam path.

The optical member for controlling the intensity distribution of the illuminating light (or the secondary light source) over the first plane in the illumination optical system such that the intensity of the illuminating light in an annular first area on the first plane is higher than in another area on the first plant may be a stop member with a light-blocking portion which substantially covers the another area on the first plane so that the light intensity in the another area is substantially zero.

It is desirable for the optical member to have an intensity distribution changing member for changing at least one of the outer and inner radii of the annular first area. The intensity distribution changing member may have a plurality of stop members which are different from each other in at least one of the outer and inner radii of an annular aperture, and a member for retaining the stop members such that one of the stop members is placed in the optical path of the illumination optical system. It is desirable for the phase-contrast member to change at least one of the radial width and position of the annular second area in accordance with a change of at least one of the outer and inner radii of the first area.

The change of the outer and/or inner radius (i.e., the radial width and/or position) of the above-described annular first area (secondary light source) or the change of the intensity distribution of illuminating light can be realized by disposing an aperture stop which is formed, for example, by a liquid crystal device or an electrochromic device, at the illumination system pupil plane, or arranging a mechanism whereby one of a plurality of stop members which are different from each other in at least one of the outer and inner radii of the aperture portion can be interchangeably disposed in the optical path. Alternatively, the arrangement may be such that a variable aperture stop is placed at the pupil plane so that the aperture diameter can be changed as desired (alternatively, a plurality of aperture stops having different aperture diameters are arranged to be capable of being interchangeably disposed in the optical path), thereby changing the outer radius of the first area. Further, a plurality of circular light-blocking plates having different diameters are arranged to be capable of interchangeably disposed in the optical path, thereby changing the inner radius of the first area.

The change of the outer and/or inner radius (i.e., the radial position and/or width) of the above-described annular second area can be realized, for example, by arranging a mechanism whereby one of a plurality of transparent substrates which are different from each other in at least one of the radial position and width of an annular phase shifter (dielectric film or the like) or an annular recess (or projection) can be interchangeably disposed in the optical path. It should be noted that a phase shifter may be provided in an area other than the annular second area instead of providing the annular phase shifter. Alternatively, the change of the outer and/or inner radius of the second area may be realized simply by arranging a plurality of circular transparent plates which are approximately equal in optical thickness but different in diameter from each other such that one of these plates can be interchangeably disposed in the optical path. It should, however, be noted that when the outer radius of the above-described first area is changed, it is impossible to give a phase difference between the image-forming light beam in the second area, which is an image-forming relation to the changed first area, and the image-forming light beam outside the second area; however, no problem will arise unless the image contrast or fidelity is degraded to such an extent that the desired position detection accuracy cannot be obtained by the change in the outer radius of the first area. It should be noted that, if the degradation of the image contrast or fidelity causes a problem, the image-forming light beam distributed outside the second area should preferably be block by a variable aperture stop, for example.

In the present invention, it is noted that a position detection mark on a substrate, e.g., a wafer, generally has a predetermined periodicity (period P) in the direction for position detection. In order that diffracted light, exclusive of zeroth-order diffracted light (regularly reflected by the mark), generated by the periodicity of the mark should contribute efficiently to the formation of a mark image, stops (light-blocking portions) for realizing dark-field conditions are respectively set for the secondary light source of the illumination optical system [i.e., the illuminating light beam distribution or illuminating light intensity distribution at a Fourier transform plane (pupil plane) in the illumination optical system] and at a Foureir transform plane (pupil plane) in the image-forming optical system, that is, at a plane conjugate to the pupil plane of the illumination optical system). Consequently, it is possible to efficiently utilize useful diffracted light while effectively blocking unwanted zeroth-order diffracted light.

That is, in the present invention, an illuminating light beam (secondary light source) at a first plane (pupil plane) in the illumination optical system which is practically in optical Foureir transform relation to a position detection mark is restricted within a substantially annular first area which is centered at an optical axis of the illumination optical system, and an image-forming light beam is substantially blocked which is distributed over a substantially annular second area, which is in image-forming relation to the first area, on a second plane (pupil plane) in the image-forming optical system which is in practically optical Foureir transform relation to the position detection mark. In other words, zeroth-order light from the position detection mark which is distributed over the second plane is substantially blocked. Alternatively, the illuminating light intensity distribution over the first plane in the illumination optical system is made high in the annular first area than in another area on the first plane, and the image-forming light beam distributed over the substantially annular second area, which is in image-forming relation to the first area, on the second plane in the image-forming optical system is substantially blocked. The arrangement may be such that the illuminating light beam is allowed to pass through only an annular first area on a practical pupil plane of the illumination optical system, and the image-forming light beam is allowed to pass through only an area other than an annular second area on a practical pupil plane of the image-forming optical system.

Accordingly, it becomes possible to detect the position of a position detection mark reliably (with an image of high contrast, even a position detection mark having an extremely small height difference (step) between the recessed and projecting portions of the mark. It should be noted that the annular second area on the second plane in the image-forming optical system need not completely be shielded from light, and that the annular second area may be given a predetermined transmittance, that is, the annular second area may be formed as a light-reducing portion, provided that the desired position detection accuracy can be obtained even if the image contrast or fidelity is slightly degraded. Although the above-described first and second areas have annular shapes, these area may have another shape, for example, a rectangular, square or polygonal (particularly, regular polygonal) shape. Further, the first area on the first plane (pupil plane) in the illumination optical system may be partially shielded (for formed as a light-reducing portion). That is, the first area may comprise a plurality of partial area (having any desired shape, e.g., a circular-arc shape, a circular shape, or a straight-line shape). Correspondingly, the second area on the second plane (pupil plane( in the image-forming optical system may be formed in the same shape as the first area. Alternatively, the second area may be formed in the shape of an annular ring, a rectangle, a polygon, etc. substantially containing a plurality of partial areas which are in image-forming relation to the first area.

Further, the outer radius $r_o$ and inner radius $r_i$ of the annular first area are set so as to satisfy the following conditions:

$$r_i \geq \lambda 2/(2 \times P)$$

$$r_o - r_i \leq \lambda 1/P$$

were $\lambda 1$ is the shortest wavelength in the wave band of light beams contributing to the formation of the image signal in the illuminating light, $\lambda 2$ is the longest wavelength in the wave band, and P is the period of the position detection mark.

In addition, the numerical aperture $NA_o$ of the image-forming optical system is set so as to satisfy the following condition:

$$NA_o \geq r_o + \lambda 2/P$$

Accordingly, an image of a position detection mark of low step can be detected with high contrast. Further, it is preferable to provide a variable aperture stop (NA stop) for changing the numerical aperture $NA_o$ of the image-forming optical system at the second plane (pupil plane) in the image-forming optical system or at a plane conjugate to it such that the variable aperture stop will not mechanically interfere with the image-forming light beam limiting member (or the light-blocking member or the second stop member). Thus, even when the period of the position detection mark to be detected changes, the numerical aperture of the image-forming optical system can be set at a value corresponding to the new period so as to satisfy the above-described condition. Accordingly, the mark image can be detected with high contract at all times. It should be noted that the variable aperture stop may be displaced in the optical axis direction relative to the pupil plane of the image-forming optical system or the plane conjugate to it.

Further, the apparatus is provided with a member for retaining the image-forming light beam limiting member (or the light-blocking member of the second stop member) in such a manner that the image-forming light beam limiting member can be selectively inserted into and withdrawn from the optical path of the image-forming optical system. Accordingly, bright-field detection and dark-field detection can be switched over from one to the other, and thus it is possible to select either of the two different detection modes accordingly to the step height of the position detection mark to be detected. Therefore, a mark image of high contrast can be obtained at all times independently of the step height of the position detection mark, and the position detection accuracy can be improved. The apparatus is also provided with a member for retaining the illuminating light beam limiting member (or the optical member or the first stop member) in such a manner that the illuminating light beam limiting member can be selectively inserted into and withdrawn from the optical path of the illumination optical system. Accordingly, annular zone illumination and ordinary illumination can be switched over from one to the other, and for a position detection mark of relatively high step, even if the reflectivity of the mark is low, the mark image can be reliably detected by the ordinary illumination.

The optical member for controlling the intensity distribution of the illuminating light over the first plane in the illumination optical system such that the intensity of the illuminating light in an annular first area on the first plane is higher than in another area on the first plane has an intensity distribution changing member for changing at least one of the outer and inner radii of the annular first area. Therefore, even when the period of the position detection mark to be detected changes, at least one of the outer and inner radii of the annular first area can be set at a value corresponding to the new period so as to satisfy the above-described condition. Accordingly, it is possible to obtain a mark image of high contrast at all times independently of the period of the position detection mark. It should be noted that the outer and inner radii of the annular first area need not be changed in accordance with a change of the period of the position detection mark to be detected, and that the outer and/or inner radius of the annular first area may be changed only when the image contrast or fidelity is degraded by a change of the period of the position detection mark to such an extent that the desired position detection accuracy cannot be obtained.

Further, the image-forming light beam limiting member changes at least one of the radial width and position of a light-blocking portion which substantially covers the annular second area in accordance with a change of at least one of the outer and inner radii of the first area. Accordingly, even when at least one of the outer and inner radii of the annular first area changes in accordance with the period of the position detection mark to be detected, it is possible to block unwanted zeroth-order diffracted light and to enable useful diffracted light other than the zeroth-order diffracted light, which contributes to the image formation, to enter the imaging device efficiently at all times. It should be noted that the width and position of the light-blocking portion of the image-forming optical system need not be changed in accordance with a change of the outer and/or inner radius of the annular first area (i.e., a change of the period of the position detection mark to be detected), and that the masking width and/or position of the light-blocking portion may be changed only when the image contrast or fidelity is degraded by a change of the outer and/or inner radius of the annular first area to such an extent that the desired position detection accuracy cannot be obtained.

It should be noted that the change of the outer and/or inner radius (i.e., the radial width and/or position) of the above-described annular first and second areas can be realized by disposing an aperture stop which is formed, for example, by a liquid crystal device or an electrochromic device, at each pupil plane. Alternatively, in the case of the illumination optical system the change of the outer and/or inner radius of the annular first area can be realized by arranging a mechanism whereby one of a plurality of stop members which are different from each other in at least one of the outer and inner radii of the aperture portion can be interchangeably disposed in the optical path of the illumination optical system; in the case of the image-forming optical system, the change of the outer and/or inner radius of the annular second area can be realized by arranging a mechanism whereby a plurality of stop members which are different from each other in at least one of the outer and inner radii of the light-blocking portion can be interchangeably disposed in the optical path of the image-forming optical system.

According to the second aspect of the present invention, the shape of a phase-contrast member and the shape of a secondary light source of the illumination optical system (i.e., the illuminating light beam distribution or the illuminating light intensity distribution over the pupil plane of the illumination optical system) are set so as to minimize the effect of the phase-contrast member on diffracted light, exclusive of zeroth-order diffracted light, generated by the periodicity of the position detection mark on a substance, e.g., a wafer. Accordingly, a phase difference can be preponderantly given to only the zeroth-order diffracted light, and it is possible to reduce the intensity of the zeroth-order diffracted light.

That is, in the present invention, the illuminating light beam at a first plane (pupil plane) in the illumination optical system which is practically in optical Fourier transform relation to the position detection mark is restricted within a substantially annular first area which is centered at an optical axis of the illumination optical system, and a phase difference is given between the image-forming light beam distributed over a substantially annular second area, which is in image-forming relation to the first area, on a second plane (pupil plane) in the image-forming optical system which is in practically optical Fourier transform relation to the position detection mark, and the image-forming light beam distributed over an area on the second plane other than the second area. In other words, a phase difference is given between zeroth-order light from the position detection mark which is distributed over the second plane and light other than the zeroth-order light.

The arrangement may be such that the intensity of distribution of the illuminating light (or secondary light source or surface illuminant) over the first plane in the illumination optical system is made higher in the annular first area than in another area, or that the illuminating light beam is allowed to pass through only the annular first area on the practical pupil plane of the illumination optical system, or that a substantially annular secondary light source (surface illuminant) which is centered at the optical axis of the illumination optical system is formed on the practical pupil plane of the illumination optical system. It is also possible to form a plurality of light source images in a substantially annular area centered at the optical axis of the illumination optical system. The arrangement may also be such that the light intensity distribution over the practical pupil plane of the illumination optical system is made higher in a substantially annular area centered at the optical axis of the illumination optical system that in an area inside the substantially annular area, and that a phase difference is given between the image-forming light beam distributed over a substantially circular area, which is in image-forming relation to the inside area, on the practical pupil plane of the image-forming optical system, and the image-forming light beam distributed over an area other than the substantially circular area.

Accordingly, it becomes possible to detect the position of a position detection mark reliably (with an image of high contrast), even a position detection mark having an extremely small height difference (step) between the recessed and projecting portions of the mark. Although the above-described first and second areas and secondary light source (surface illuminant) have annular shapes, these areas may have another shape, for example, a rectangular, square or polygonal (particularly, regular polygonal) shape. Further, the first area on the first plane (pupil plane) in the illumination system pupil plane may be partially shielded (or formed as a light-reducing portion). That is, the first area may comprise a plurality of partial areas (having any desired shape, e.g., a circular-arc shape, a circular shape, or a straight-line shape). Correspondingly, the second area on the second plane (pupil plane) in the image-forming optical system may be formed in the same shape as the first area. Alternatively, the second area may be formed in the shape of an annular ring, a rectangle, a polygon, etc. substantially containing a plurality of partial areas which are in image-forming relation to the first area.

Further, the apparatus is provided with a member for reducing the image-forming light beam distributed over the annular area on the second plane in the image-forming optical system, that is, zeroth-order diffracted light distributed over the second plane. By doing so, it is possible to reduce the intensity ratio of zeroth-order diffracted light to diffracted light of other orders from the position detection mark, and hence possible to detect the position detection mark image with higher contrast.

Further, the outer radius $r_o$ and inner radius $r_i$ of the annular first area are set so as to satisfy the following conditions:

$$r_i \geq \lambda 2/(2 \times P)$$

$$r_o - r_i \leq \lambda 1/P$$

where $\lambda 1$ is the shortest wavelength in the wave band of light beams contributing to the formation of the image signal in the illuminating light, $\lambda 2$ is the longest wavelength in the wave band, and P is the period of the position detection mark.

In addition, the numerical aperture $NA_o$ of the image-forming optical system is set so as to satisfy the following condition:

$$NA_o \geq r_o + \lambda 2/P$$

Accordingly, an image of a position detection mark of low step can be detected with high contrast.

Further, it is preferable to provide a variable aperture stop (NA stop) for changing the numerical aperture $NA_o$ of the image-forming optical system at the second plane (pupil plane) in the image-forming optical system or at a plane conjugate to it such that the variable aperture stop will not mechanically interfere with the phase-contrast member. Thus, even when the period of the position detection mark to be detected changes, the numerical aperture of the image-forming optical system can be set at a value corresponding to the new period so as to satisfy the above-described condition. Accordingly, the mark image can be detected with high contrast at all times. It should be noted that the variable aperture stop may be displaced in the optical axis direction relative to the pupil plane of the image-forming optical system or the plane conjugate to it.

Further, the apparatus is provided with a member for retaining the phase-contrast member in such a member that the phase-contrast member can be selectively inserted into and withdrawn from the optical path of the image-forming optical system. Accordingly, phase-contrast detection and bright-field detection can be switched over from one to the other, and thus it is possible to select either of the two different detection modes, that is, to determine whether to use the phase-contrast member, according to the step height of the position detection mark to be detected. Therefore, a mark image of high contrast can be obtained at all times independently of the step height of the position detection mark, and the position detection accuracy can be improved.

The apparatus is also provided with a member for retaining the illuminating light beam limiting member (or the optical member or the first stop member) in such a manner that the illuminating light beam limiting member can be selectively inserted into the and withdrawn from the optical path of the illumination optical system. Accordingly, annular zone illumination and ordinary illumination can be switched over from one to the other, and for a position detection mark of relatively high step, even if the reflectivity of the mark is low, the mark image can be reliably detected by the ordinary illumination.

The optical member for controlling the intensity distribution of the illuminating light (or secondary light source of surface illuminant) over the first plane in the illumination optical system such that the intensity of the illuminating light in an annular first area on the first plane is higher than in another area on the first plane has an intensity distribution changing member for changing at least one of the outer and inner radii of the annular first area. Therefore, even when the period of the position detection mark to be detected changes, at least one of the outer and inner radii of the annular first area can be set at a value corresponding to the new period so as to satisfy the above-described condition. Accordingly, it is possible to obtain a mark image of high contrast at all times independently of the period of the position detection mark. It should be noted that the outer and inner radii of the annular first area need not be changed in accordance with a change of the period of the position detection mark, and that the outer and/or inner radius of the annular first area may be changed only when the image contrast or fidelity is degraded by a change of the period of the position detection mark to such an extent that the desired position detection accuracy cannot be obtained.

Further, the phase-contrast member changes at least one of the radial width and position of the annular second area in accordance with a change of at least one of the outer and inner radii of the first area. Accordingly, even when at least one of the outer and inner radii of the annular first area changes in accordance with the period of the position detection mark to be detected, it is possible to enable diffracted light to enter the imaging device while giving a phase difference to only the zeroth-order diffracted light at all times. It should be noted that the width and position of the annular second area of the image-forming optical system need not be changed in accordance with a change of the outer and/or inner radius of the annular first area (i.e., a change of the period of the position detection mark to be detected), and that the width and/or position of the phase shift portion may be changed only when the image contrast or fidelity is degraded by a change of the outer and/or inner radius of the annular first area to such an extent that the desired position detection accuracy cannot be obtained. Further, it is not necessary to change both the outer and inner radii of the second area in accordance with a change of the outer and inner radii of the first area; it suffices to change only the inner radius, for example, of the second area.

DETAILED DESCRIPTION OF PREFERRED EMBODIMENTS

Figure 1:
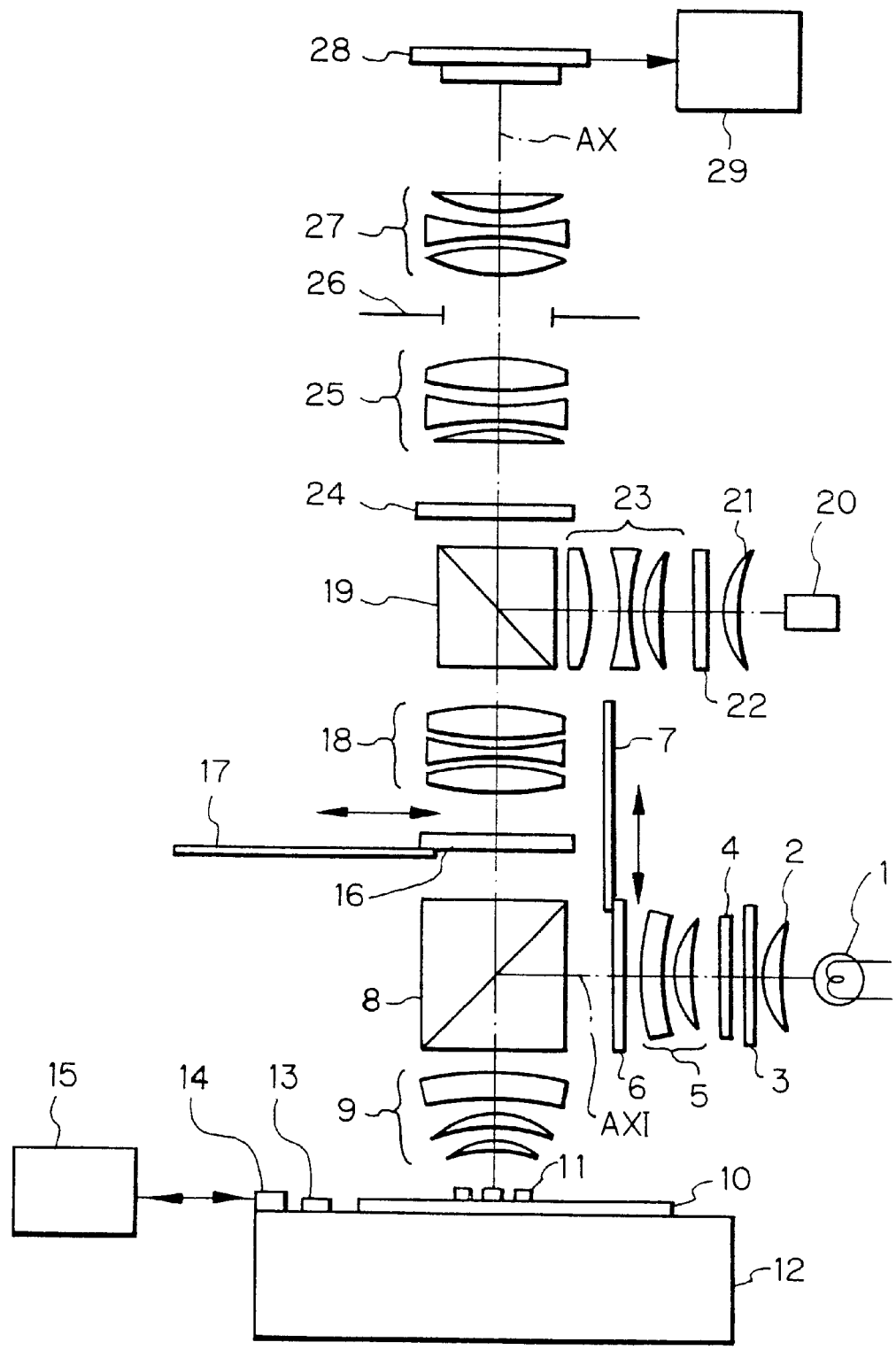
FIG. 1 schematically shows the whole arrangement of a position detection apparatus according to one embodiment of the present invention.

First, one embodiment of the present invention will be described with reference to FIGS. 1 to 5(B). FIG. 1 schematically shows the whole arrangement of a position detecting apparatus according to this embodiment. Referring to FIG. 1, a light source 1, e.g., a halogen lamp, emits a bundle of broad-band illuminating light rays (i.e., broad-band light). The illuminating light passes through a condenser lens 2 and a wavelength selecting device (e.g., a sharp-cut filter or an interference filter) 3 and then enters an illumination field stop 4.

The wavelength selecting device 3 transmits only a bundle of light rays in a band of wavelengths (e.g., wavelengths of 550 nm to 750 nm) to which a photoresist coated on a wafer 10 (described later) is not responsive (the exposure wavelength is, for example, 365 nm or 248 nm). However, when the present invention is applied to a position detecting apparatus for a substrate which is not coated with a photoresist, e.g., an apparatus for positioning the overlay position of a circuit pattern and a transferred resist pattern on a wafer after exposure and development processing it is unnecessary to prevent undesired exposure of a photoresist; therefore, it is possible to use light of a shorter wavelength (close to the exposure wavelength).

The light beam passing through the illumination field stop 4 passes through a relay lens 5 and enters an illuminating light beam limiting member (aperture stop) 6 according to the present invention. Further, the illuminating light passes through a beam splitter 8 and an objective lens unit 9 and impinges on a wafer 10 provided with a position detection mark 11. The illuminating light beam limiting member 6 is placed at a plane (hereinafter referred to as "illumination system pupil plane") which is in optical Fourier transform relation to the surface (i.e., the position detection mark 11) of the wafer 10 with respect to the objective lens unit 9 and the beam splitter 8. Accordingly, the amount of positional displacement of a predetermined point in the illuminating light beam limiting member 6 from an optical axis AXI of the illumination optical system (1 to 5, 8 and 9) is proportional to the sine of the incident angle to the surface of the wafer 10 of the illuminating light beam passing through the predetermined point.

Figure 5A:
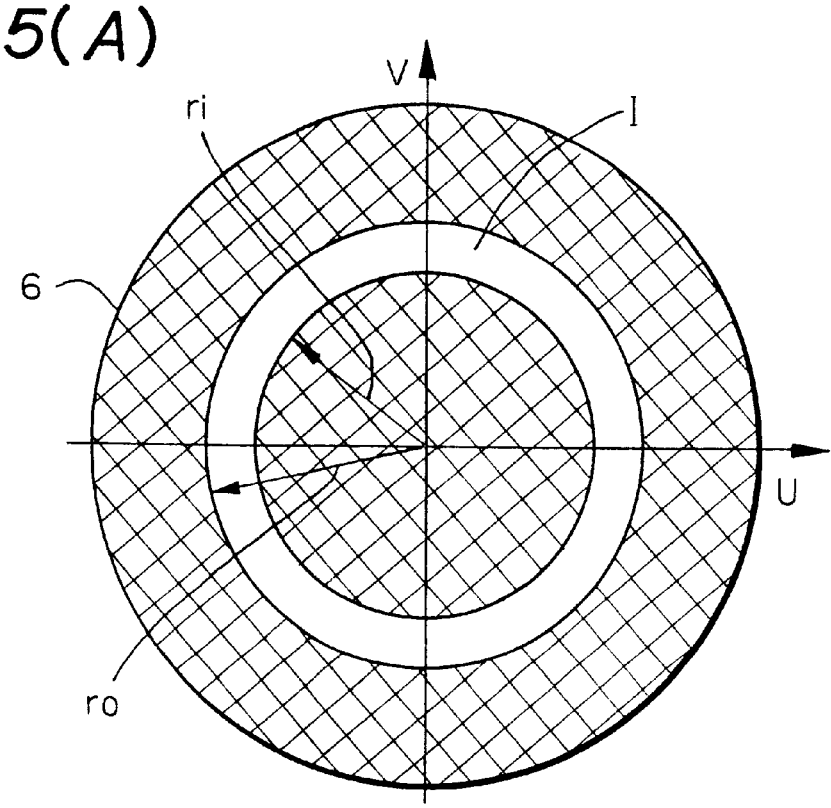
FIG. 5(A) shows a specific arrangement of an illuminating light beam limiting member.

The illuminating light beam limiting member 6 has an annular aperture, as shown in FIG. 5(A), and it is retained by a movable member 7 such that the center of the annular aperture coincides with the optical axis AXI of the illumination optical system. The movable member 7 is, for example, a turret plate or a slider, which enables the illuminating light beam limiting member 6 to be inserted into and withdrawn from the optical path of the illumination optical system. In this embodiment, therefore, annular zone illumination and ordinary illumination can be switched over from one to the other by the movable member 7, and thus it is possible to select either of the two different illumination modes according to the height of step [and/or the degree of fineness (period, line width, etc.)] of the position detection mark 11. For example, when a position detection mark of low step or a fine position detection mark of high step is to be detected, the annular zone illumination mode is selected, and the illuminating light beam limiting member 6 is inserted into the optical path; when a rough position detection mark of high step is to be detected, the ordinary illumination mode is selected, and the illuminating light beam limiting member 6 is withdrawn from the optical path.

The illumination field stop 4 is practically conjugate (in image-forming relation) to the surface (i.e. the position detection mark 11) of the wafer 10 with respect to the series of optical systems 5 to 9. Thus, the illumination range on the wafer 10 can be limited according to the shape and size of the transmitting portion of the illumination field stop 4. The illumination field stop 4 comprises, for example, a plurality of movable blades, so that the illumination range on the wafer 10 can be varied by changing the size and shape of an aperture defined by the movable blades according to the size and shape of the position detection mark 11.

The wafer 10 is placed on a two-dimensionally movable wafer stage 12. A mirror 14 is fixed on an end portion of the wafer stage 12 to reflect a laser beam applied from a laser interferometer 15. Positions in directions X and Y of the wafer stage 12 (i.e., the wafer 10) are constantly detected by the laser interferometer 15 at a resolution of the order of 0.01 $\mu$m, for example. Further, the wafer stage 12 is provided with a fiducial mark board 13 formed with a fiducial mark which is used for measurement, for example, of the base line.

Incidentally, a light beam reflected from the wafer 10 (i.e., the position detection mark 11) reaches an image-forming light beam limiting member (aperture stop) 16 according to the present invention through the objective lens unit 9 and the beam splitter 8. The image-forming light beam limiting member 16 is placed at a plane (hereinafter referred to as "image-forming system pupil plane") which is in optical Fourier transform relation to the surface (i.e., the position detection mark 11) of the wafer 10 with respect to the objective lens unit 9 and the beam splitter 8. Accordingly, the amount of positional displacement of a predetermined point in the image-forming light beam limiting member 16 from an optical axis AX of the image-forming optical system is proportional to the sine of the exit angle to the surface of the wafer 10 of a light beam (image-forming light beam) passing through the predetermined point.

Figure 5B:
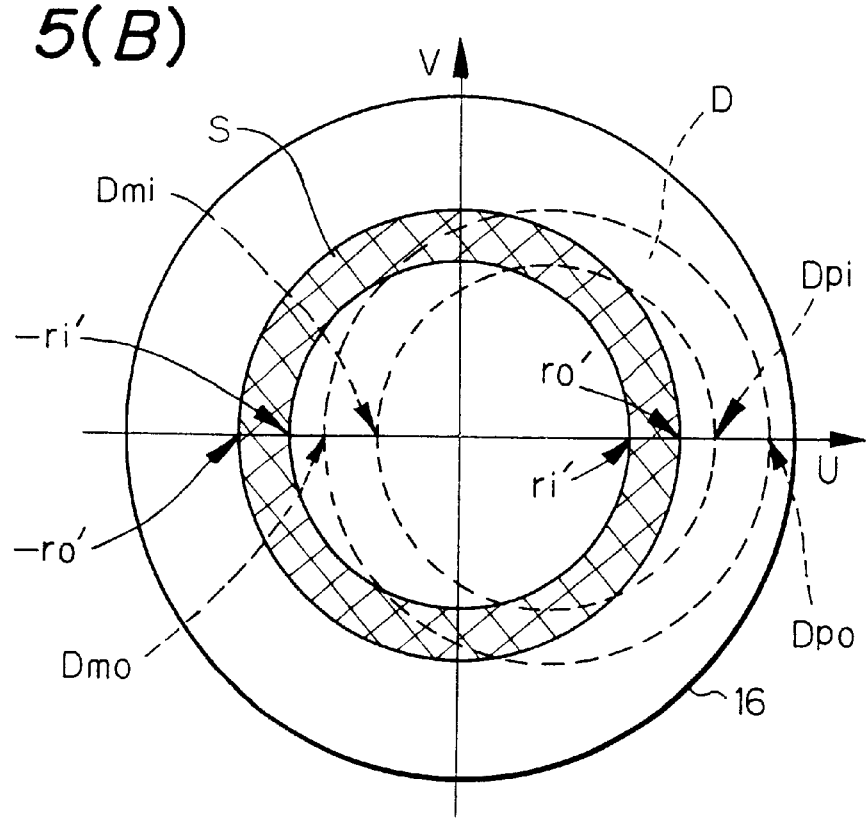
FIG. 5(B) shows a specific arrangement of an image-forming light beam limiting member.

As shown in FIG. 5(B), the image-forming light beam limiting member 16 has a light-blocking portion which substantially covers an annular area which is in image-forming relation to the annular aperture of the illuminating light beam limiting member 6. The image-forming light beam limiting member 16 is retained by a movable member 17 such that the center of the annular light-blocking portion coincides with the optical axis AX of the image-forming optical system. The movable member 17 is, for example, a turret plate or a slide, which enables the image-forming light beam limiting member 16 to be inserted into and withdrawn from the optical path of the image-forming optical system. In this embodiment, therefore, dark-field detection and bright-field detection can be switched over from one to the other by the movable member 17, and thus it is possible to select either of the two different detection modes according to the step height of the position detection mark 11. For example, when a position detection mark of low step is to be detected, the dark-field detection mode is selected, and the image-forming light beam limiting member 16 is inserted into the optical path; when a position detection mark of high step is to be detected, the bright-field detection mark mode is selected, and the image-forming light beam limiting member 16 is withdrawn from the optical path.

Figure 2:
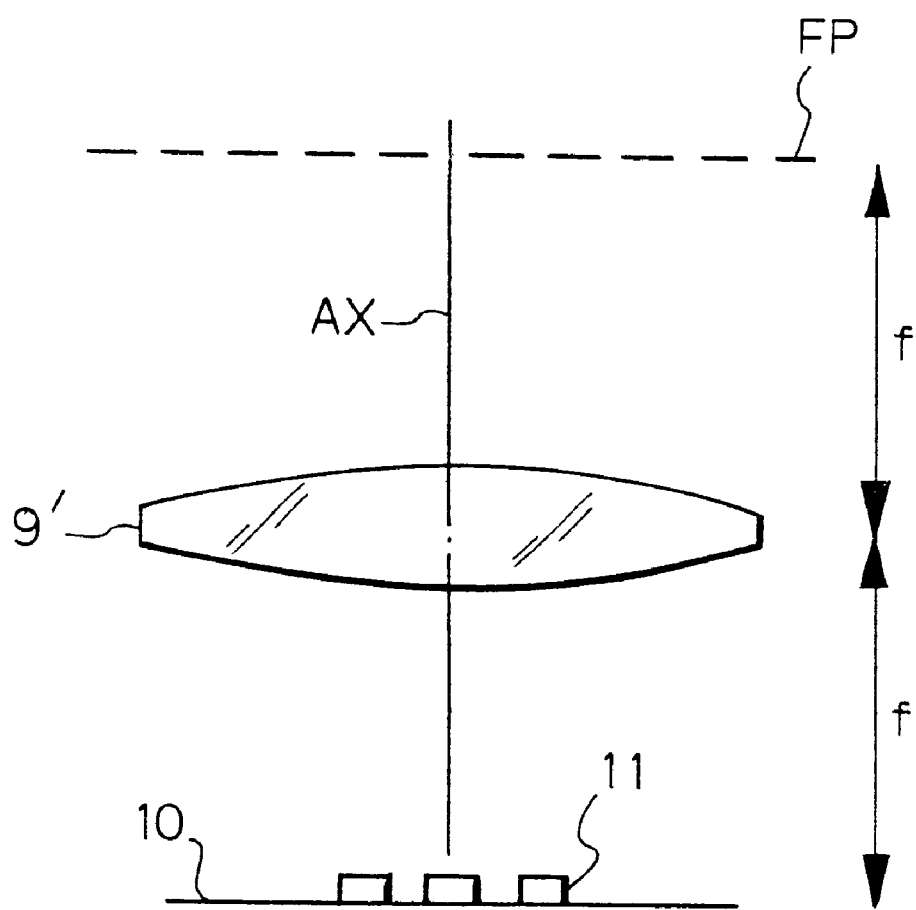
FIG. 2 illustrates an optical Fourier transform relation in the present invention.

Next, the optical Fourier transform relation will be explained with reference to FIG. 2. In FIG. 2, if the wafer 10 is placed at one focal plane of the objective lens unit 9 (the focal length of which is assumed to be f) which is represented by one lens element 9', the other focal plane forms "an optical Fourier transform plane (pupil plane)" FP. Light beams incident on and exiting from the wafer 10 at an angle $\theta$ each pass through a point on the Fourier transform plane (pupil plane) FP which is apart from the optical axis AX by $f \cdot \sin\theta$.

Although in FIG. 2 the objective lens unit 9 is represented by one lens element 9', it does not make a substantial difference whether it comprises one lens 9' or a plurality of lens elements. If the wafer 10 is placed at a composition focal plane of a plurality of lens elements, the other focal plane forms a Fourier transform plane (pupil plane). By disposing the beam splitter 8 between the objective lens unit 9 and the pupil plane, it is possible to separate the light-transmitting side (illumination system) pupil plane and the light-receiving side (image-forming system) pupil plane from each other. The two separated pupil planes are both Fourier transform planes with respect to the wafer 10. That is, the illumination system pupil plane and the image-forming system pupil plane are practically conjugate (in image-forming relation) to each other with respect to the wafer 10, the objective lens unit 8 and the beam splitter 8.

The image-forming light beam passing through the image-forming light beam limiting member 16 passes through a lens system 18 and a beam splitter 19 and forms an image of the position detection mark 11 on an index board 24. The index board 24 is also illuminated by an index board illumination optical system which comprises a light source 20, e.g., a light-emitting diode, a condenser lens 21, an index board illumination field stop 22, and a relay lens 23. The index board illumination field stop 22 is conjugate to the index board 24, and hence the surface of the wafer 10, with respect to the relay lens 23 and the beam splitter 19. Further, the index board 24 is provided with fiducial indexes (index marks) used in detection of the position detection mark 11 (described later). The index board illumination field stop 22 has apertures in respective area which are in image-forming relation to the fiducial indexes on the index board 24 so that only the fiducial indexes are illuminated by illuminating light from the light source 20.

The index board illumination optical system (20 to 23) is arranged to illuminate the fiducial indexes; therefore, illuminating light from the light source 20 may be monochromatic light unlike the illuminating light from the light source 1, which is used to illuminate the position detection mark 11. Further, the illuminating light from the light source 20 may be light of a wavelength to which the photoresist on the wafer 10 is responsive because it is not applied to the wafer 10. In this embodiment, therefore, the wavelength of the light source 20, which is a light-emitting diode, is set to about 500 nm, and the reflecting surface of the beam splitter 19 is formed by a dichroic mirror. By doing to, it is possible to increase the utilization efficiency of the image-forming light beam from the wafer 10 and the index illuminating light (i.e., it is possible to minimize the loss of light quantity). It should be noted that the image of the position detection mark 11 will not be superimposed on either of the fiducial indexes because the illumination area on the wafer 10 is limited by the illumination field stop 4.

The image of the position detection mark 11 and the images of the fiducial indexes, which are provided on the index board 24, are each formed on an imaging device 28, e.g., a CCD, by relay lenses 25 and 27. An image processing system 29 calculates a positional relationship (i.e., an amount of positional displacement) between the fiducial index images and the image of the position detection mark 11 on the basis of an output signal from the imaging device 28. The image position of the position detection mark 11, needless to say, reflects the position of the position detection mark 11 in an orthogonal coordinate system XY which is defined by the laser interferometer 15. Therefore, the position of the position detection mark 11 can be detected by calculating the positional relationship between the fiducial index images and the image of the position detection mark 11. That is, the position of the position detection mark 11 is determined on the basis of the amount of positional displacement calculated by the image processing system 29 and the coordinate position output from the laser interferometer 15.

Incidentally, an aperture stop 26 is placed at a plane in the image-forming optical system (9 to 27) which is practically in optical Fourier transform relation to the wafer 10 [i.e., a plane conjugate (in image-forming relation) to the image-forming light beam limiting member 16] to limit the numerical aperture of the image-forming optical system. In this embodiment, the system is arranged such that the numerical aperture of the image-forming optical system can be changed as desired by the aperture stop 26. Although in FIG. 1 the index board 24 is disposed in the optical path of the image-forming optical system, the arrangement may be such that the index board 24 is disposed outside the optical path, and that images of the fiducial indexes are formed on the imaging device 28 through an image-forming system. For example, if the imaging device 28 is disposed in place of the index board 24, and the index board 24 is disposed in place of the index board illumination field stop 22, the relay lenses 25 and 27 become unnecessary, and it becomes possible to reduce the overall size of the apparatus. In this case, it is preferable to shield the area other than the fiducial indexes on the index board 24 so that light from an area other than the fiducial indexes will not enter the imaging device 28. Further, the aperture stop 26 should preferably be disposed in close proximity to the image-forming light beam limiting member 16 such that these members will not mechanically interfere with each other.

Next, examples of the shape of the position detection mark 11, the shapes of transmitting portions of the index board 24, the index board illumination field stop 22 and the illumination field stop 4 and the intensity distributions of images formed on the imaging device 28 will be explained with reference to FIGS. 3(A) to 4(C). FIG. 4(A) is a top plan view of the position detection mark 11, and FIG. 4(B) is a sectional view of the position detection mark 11 taken in a position measuring direction (i.e., a direction X in FIG. 4(A)). That is, in this embodiment, the surface of the wafer 10 is provided with a position detection mark 11 comprising three belt-shaped recesses which are arranged in the direction X at a period P. Further, as shown in FIG. 4(B), the surface of the wafer 10 is coated with a photoresist 10'.

Figure 3A:
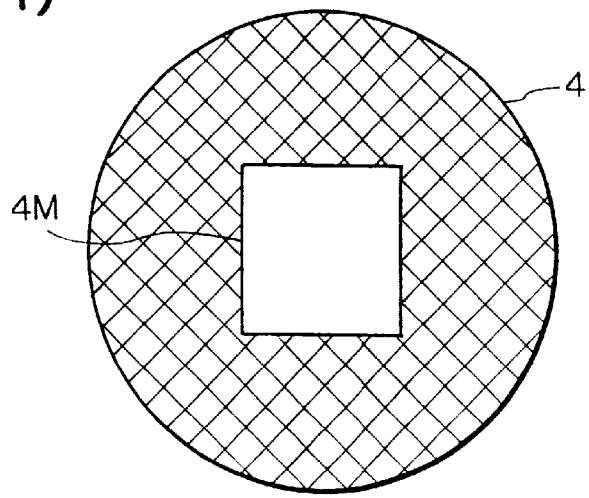
FIG. 3(A) shows the arrangement of an illumination field stop.
Figure 3C:
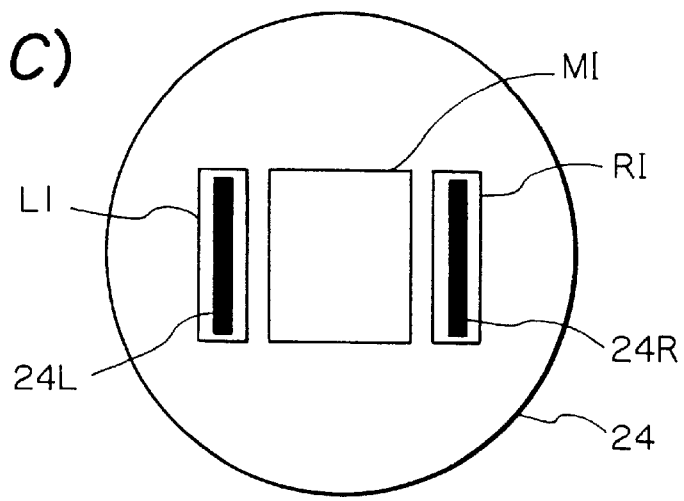
FIG. 3(C) shows the arrangement of an index board.
Figure 4A:
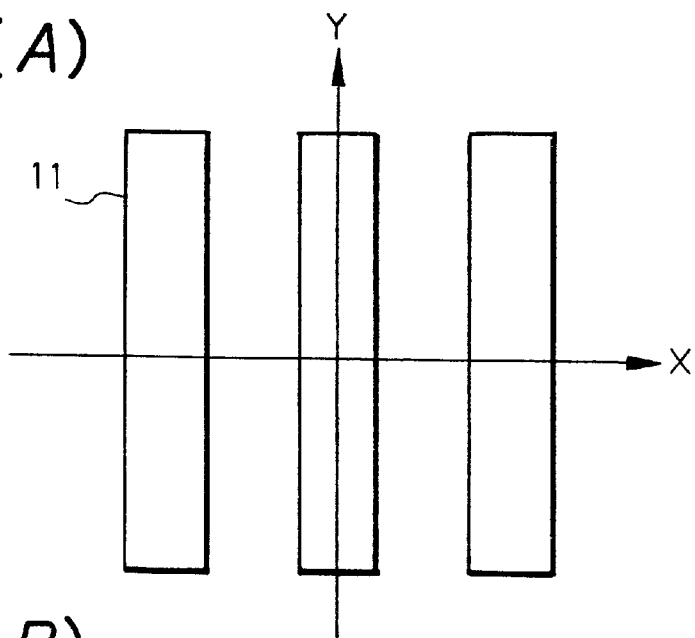
FIGS. 4(A) and 4(B) show a specific arrangement of a position detection mark.
Figure 4B:
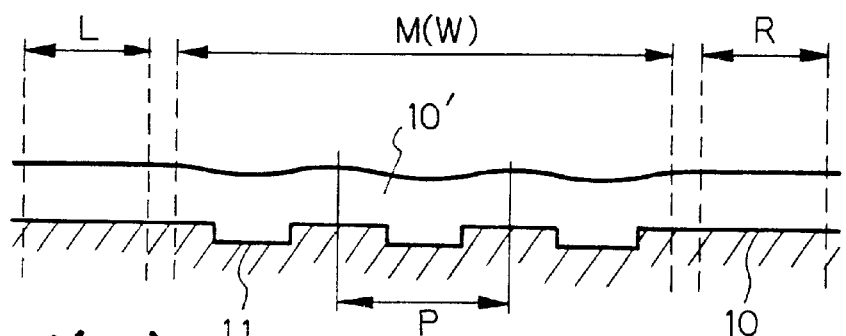

The illumination field stop 4 is arranged as shown in FIG. 3(A). That is, the whole area of the illumination field stop 4, except a quadrangular transmitting portion 4M which limits the illumination area on the wafer 10, is a light-blocking portion (shaded portion). An image of the transmitting portion 4M is projected onto the wafer 10 to illuminate only a partial area containing the position detection mark 11. The illumination area corresponds to a mark area M (having a width W in the direction X) in FIG. 4(B), and also corresponds to a mark image area MI on the index board 24, which is shown in FIG. 3(C). That is, an image of the position detection mark 11 is formed in the mark image area MI on the index board 24.

Figure 3B:
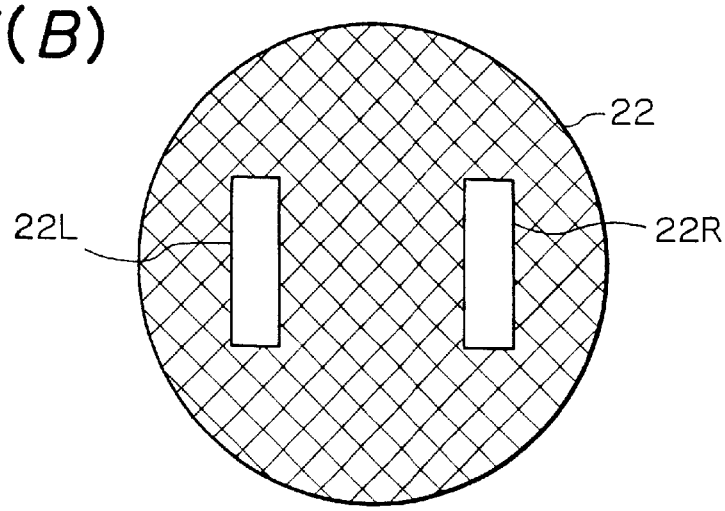
FIG. 3(B) shows the arrangement of an index board illumination field stop.

As shown in FIG. 3(B), the index board illumination field stop 22 is also arranged such that the whole area thereof, except two quadrangular transmitting portions 22L and 22R, is a light-blocking portion (shaded portion). Light passing through the transmitting portions 22L and 22R illuminates rectangular areas (transmitting portions) LI and RI on the index board 24, shown in FIG. 3(C). In the rectangular areas LI and RI, the above-described fiducial indexes (bar marks) 24L and 24R, which are light-blocking portions, are provided, respectively.

Figure 4C:
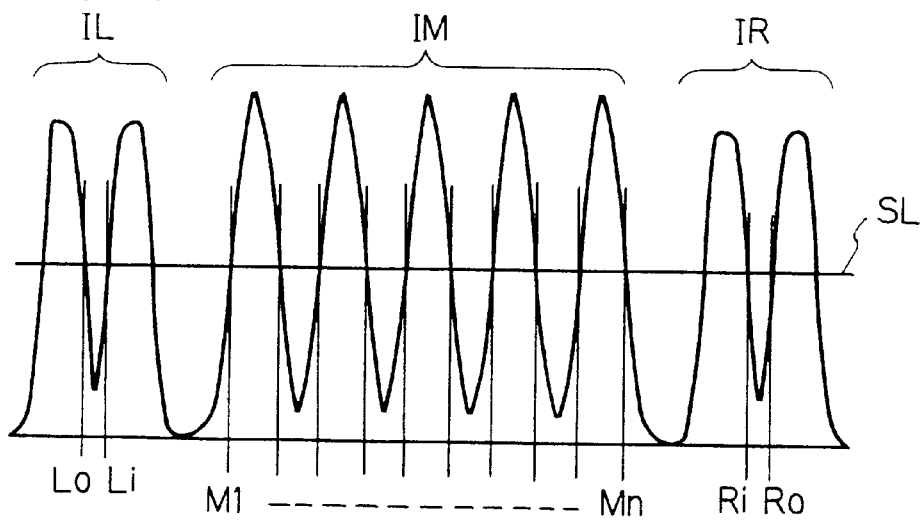
FIG. 4(C) shows intensity distributions of images formed on an imaging device.

Thus, intensity distributions of images formed on the imaging device 28 are as shown in FIG. 4(C). That is, an image IM of the position detection mark 11 illuminated by illuminating light from the light source (halogen lamp) 1 is formed in the center, and images (dark images) IL and IR of the fiducial indexes 24L and 24R illuminated by illuminating light from the light source (light-emitting diode) 20 are formed at the left and right of the position detection mark image IM. It should be noted that, in the present invention, the position detection mark 11 is illuminated in a dark-field illumination manner, as described above and also later, and therefore the image IM of the position detection mark 11 is in double-period relation to the mark 11. Further, although in the sectional view of FIG. 4(B) areas L and R which are on the left and right, respectively, of the position detection mark 11 are shown as being flat areas, it should be noted that the condition of the areas L and R has no effect on the position detection of the position detection mark 11 (that is, the areas L and R are not illustrated by illuminating light). Therefore, no problem arises even if a circuit pattern or the like is present in the area L or R.

The image processing system 29 calculates a positional relationship between the image IM of the position detection mark 11 and the images IL and IR of the fiducial indexes 24L and 24R on the basis of a light intensity signal such as that shown in FIG. 4(C), which is output from the imaging device 28. The calculating process is the same as the processing which is generally executed in the conventional imaging type position detection. For example, position detection may be carried out on the basis of slice positions ($L_o$, $L_i$, $M_1$ to $M_n$, $R_i$ and $R_o$) of the light intensity signal at a predetermined slice level SL. It is also possible to effect position detection on the basis of the correlation between a certain template signal and a light intensity signal for the mark portion.

It is necessary to measure a positional relationship of the fiducial indexes 24L and 24R, which are used as references for a detected position, to the wafer 10 (i.e., the wafer stage 12) prior to the above-described position detection. This is processing known as "base line check", which has also heretofore been known. The base line check processing in this embodiment is basically the same as the conventional processing. That is, the surface of the fiducial mark board 13, which is fixed on the wafer stage 12, has previously been formed with a fiducial mark of the same configuration as the position detection mark 11. Prior to the detection of the position detection mark 11, the fiducial mark is moved to a position under the objective lens unit 9 by driving the wafer stage 12, and a positional relationship between the fiducial mark and the fiducial indexes 24L and 24R is detected. At the same time, the position of the wafer stage 12 (i.e., the position of the mirror 14 on the wafer stage 12) at this time is measured with the laser interferometer 15. The sum of the output value of the interferometer 15 and the detected value (i.e., the positional relationship detected by the image processing system 29) is stored in memory as "base line quantity". A value that is obtained by subtracting the "base line quantity" from the sum of the output value of the interferometer 15 at the time of measuring the position detection mark 11 and the positional relationship between the position detection mark 11 and the fiducial indexes 24L and 24R, which is obtained from the above-described light intensity signal, is determined to be the position of the position detection mark 11 relative to the fiducial mark.

When the present invention is applied to a position detecting system (i.e., alignment system) of a projection exposure system, each shot area on a wafer is moved to a position under a projection optical system (not shown) on the basis of the above-described position detection value and exposure shot array data stored in the projection exposure system, and overlay exposure is carried out for each shot area.

Next, the illuminating light beam limiting member 6 and the image-forming light beam limiting member 16 in this embodiment will be explained on the assumption that a position detection mark 11 having a period of 8 μm is illuminated by an illuminating light beam in a wave band of 550 nm to 750 nm to detect the position of the mark 11.

FIGS. 5(A) and 5(B) respectively show the arrangements of the illuminating light beam limiting member 6 and the image-forming light beam limiting member 16, which are suitable for the above-described conditions. In the figures, the directions of U- and V-axes are equivalent to the X- and Y-axis directions of the position detection mark 11 shown in FIG. 4(A). In this embodiment, however, the two axes in FIGS. 5(A) and 5(B) are denoted by U- and V-axes according to the established practice because the illuminating light beam limiting member 6 and the image-forming light beam limiting member 16 are each placed at an optical Fourier transform plane (pupil plane) relative to the position detection mark 11.

As shown in FIG. 5(A), the illuminating light beam limiting member 6 comprises a light-blocking substrate which has an annular transmitting portion I centered at the optical axis (i.e., the intersection between the U- and V-axes) of the illumination optical system (1 to 9). The annular transmitting portion I has an inner radius $r_i$ of 0.16 (in terms of numerical aperture; the same shall apply hereinafter) and an outer radius $r_o$ of 0.20. On the other hand, the image-forming light beam limiting member 6 has, as shown in FIG. 5(B), an annular light-blocking portion S (the shaded portion in the figure) formed at a position conjugate to the annular transmitting portion I of the illuminating light beam limiting member 6. The annular light-blocking portion S has an inner radius $r_i^1$ of 0.15 and an outer radius $r_o^1$ of 0.21 so as to be slightly larger than the annular transmitting portion I of the illuminating light beam limiting member 6. The reason why the annular light-blocking portion S is made larger than the annular transmitting portion I is to block zeroth-order diffracted light (regularly reflected light) from the position detection mark 11 even more surely in consideration of the fact that zeroth-order diffracted light slightly spreads on the image-forming light beam limiting member 16. The image-forming optical system is assumed to have a numerical aperture $NA_o$ (radius of the image-forming system pupil plane) of 0.30. It should be noted that in FIG. 1 the aperture stop 26, which determines an actual numerical aperture, is disposed not at the same position as the image-forming light beam limiting member 16 but at a position conjugate to it; in a case where the numerical aperture of the aperture stop 26 is reduced to a value smaller than the numerical aperture of the objective lens unit 9, the numerical aperture $NA_o$ represents the numerical aperture (effective numerical aperture) of the aperture stop 26. Further, the radius of the outer periphery of the illuminating light beam limiting member 6 is sufficiently larger than the numerical aperture $NA_o$, so that transmitted light which is distributed outside the annular transmitting portion I cannot reach the position detection mark 11, as a matter of course.

In this embodiment, the illuminating light beam limiting member 6 may be a metal light-blocking plate having an annular aperture provided in a specific part thereof. Alternatively, the illuminating light beam limiting member 6 may be prepared by forming a light-blocking film of a metal or the like on a transparent substrate of glass or the like and removing the film from a specific part. As the image-forming light beam limiting member 16, a transparent substrate of glass or the like having an annular light-blocking portion formed on a specific part thereof from a metal thin film or the like is used.

FIG. 5(B) shows a distribution (an area D surrounded by two chain-line circles in the figure) over the image-forming light beam limiting member 16 of one first-order diffracted light generated from the position detection mark 11 by illumination with illuminating light passing through the annular transmitting portion I of the illuminating light beam limiting member 6 shown in FIG. 5(A). It should be noted that zeroth-order diffracted light among diffracted light beams from the position detection mark 11 is blocked by the annular light-blocking portion S which is conjugate to (and one size larger than) the annular transmitting portion I. Although diffracted light beams of other orders are also distributed in actuality, consideration is herein given to only first-order diffracted light, which plays a dominant role in forming the image of the position detection mark 11.

Incidentally, a part of the first-order diffracted light is blocked by the annular light-blocking portion S, as shown in FIG. 5(B). In this embodiment, however, blocking of the first-order diffracted light by the annular light-blocking portion S is minimized because the inner radius $r_i$ and outer radius $r_o$ of the annular transmitting portion I have been appropriately determined. The reason for this will be explained below.

First of all, U coordinates of intersections between the U-axis and the inner and outer peripheries of the annular light-blocking portion S are $r_i'$ and $r_o'$ (and $-r_i'$ and $-r_o'$), respectively. Assuming that U coordinates of the intersections between the U-axis and the boundaries (i.e., the two chain-line circles) of the area D where the first-order diffracted light is distributed are $D_{pi}$, $D_{po}$, $D_{mi}$ and $D_{mo}$, respectively, the values of these U coordinates are given by $$D_{pi}=\lambda/P+r_i, D_{po}=\lambda/P+r_o$$

$$D_{mi}=\lambda/P-r_i, D_{mo}=\lambda/P-r_o$$

It will be clear from FIG. 5(B) that, when the value of $D_{pi}$ is smaller than $r_o'$, or the value of $D_{mo}$ is smaller than $-r_i'$, in particular, the degree to which the first-order diffracted light is blocked by the annular light-blocking portion S increases. When the value of $D_{mi}$ is larger than $r_i'$ also, the degree of blocking of the first-order diffracted light similarly increases.

In the example shown in FIG. 5(A), the period P of the position detection mark 11 is 8 µm, and the inner radius $r_i$ and outer radius $r_o$ of the annular transmitting portion I are 0.16 and 0.20, respectively. In the range of wavelength λ of illuminating light, the shortest wavelength λ1 is 550 nm, and the longest wavelength λ2 is 750 nm. Therefore, when λ=λ1, the smallest value of $D_{pi}$ is given by $$D_{pi}=\lambda 1/P+r_i=0.23 \quad (1)$$

Thus, the smallest value of $D_{pi}$ is larger than $r_o'$ (=0.21). When λ=λ1, the smallest value of $D_{mo}$ is given by $$D_{mo}=\lambda 1/P-r_o=-0.13 \quad (2)$$

Thus, the smallest value of $D_{mo}$ is larger than $-r_i'$ (=−0.15).

Further, when λ=λ2, the largest value of $D_{mi}$ is given by $$D_{mi}=\lambda 2/P-r_i=-0.07 \quad (3)$$

Thus, the largest value of $D_{mi}$ is smaller than $r_i'$ (=0.15).

Accordingly, the degree to which the first-order diffracted light is blocked by the annular light-blocking portion S reduces. Conditions for minimizing the blocking of the first-order diffracted light by the annular light-blocking portion S may be generalized as follows:

$$D_{pi}=\lambda 1/P+r_i \geq r_o' \quad (4)$$

$$D_{mo}=\lambda 1/P-r_o \geq -r_i' \quad (5)$$

$$D_{mi}=\lambda 2/P-r_i \leq r_i' \quad (6)$$

Further, the outer radius $r_o'$ of the annular light-blocking portion S is larger than the outer radius $r_o$ of the annular transmitting portion I, and the inner radius $r_i'$ of the annular light-blocking portion S is smaller than the inner radius $r_i$ of the annular transmitting portion I. Accordingly, the above inequalities (4) to (6) may be rewritten as follows:

$$D_{pi}=\lambda 1/P+r_i \geq r_o \quad (7)$$

$$D_{mo}=\lambda 1/P-r_o \geq -r_i \quad (8)$$

$$D_{mi}=\lambda 2/P-r_i \leq r_i \quad (9)$$

Particularly, both the inequalities (7) and (8) are equivalent to $$r_o-r_i \leq \lambda 1/P \quad (10)$$

The inequality (9) is equivalent to $$r_i \geq \lambda 2/(2 \times P) \quad (11)$$

Accordingly, it is, generally, possible to minimize the degree to which the first-order diffracted light is blocked by the annular light-blocking portion S when the inner radius $r_i$ and outer radius $r_o$ of the annular transmitting portion I satisfy the inequalities (10) and (11).

Incidentally, there is likelihood that the first-order diffracted light will be undesirably blocked not only by the annular light-blocking portion S but also by restriction with the numerical aperture $NA_o$. That is, it is desirable that the value of $D_{po}=\lambda/P+r_o$ should be not larger than the numerical aperture $NA_o$. When λ=λ2, the largest value of $D_{po}$ is λ2/P+$r_o$. Accordingly, it is desirable for the numerical aperture $NA_o$ to satisfy the following condition:

$$NA_o \geq \lambda 2/P+r_o \quad (12)$$

Although in the foregoing description notice is taken of only first-order diffracted light which is generated on one side (in the direction +U) of zeroth-order diffracted light, it should be noted that the same is true of first-order diffracted light generated in the opposite direction (−U), and that the above-described conditions (inequalities) also hold for the first-order diffracted light generated in the direction −U. Further, it should be noted that the period P of the position detection mark 11 and the wave band (λ1 and λ2) of illuminating light beam are not necessarily limited to the above-mentioned values, and that the above-described conditions (inequalities) also hold for other values of the period P and the wave band.

Next, the effect of the position detecting apparatus according to this embodiment will be explained on the basis of a simulation result for an image of a position detection mark having an extremely small height difference between the recessed and projecting portions of the mark (i.e., step height).

Figure 6:
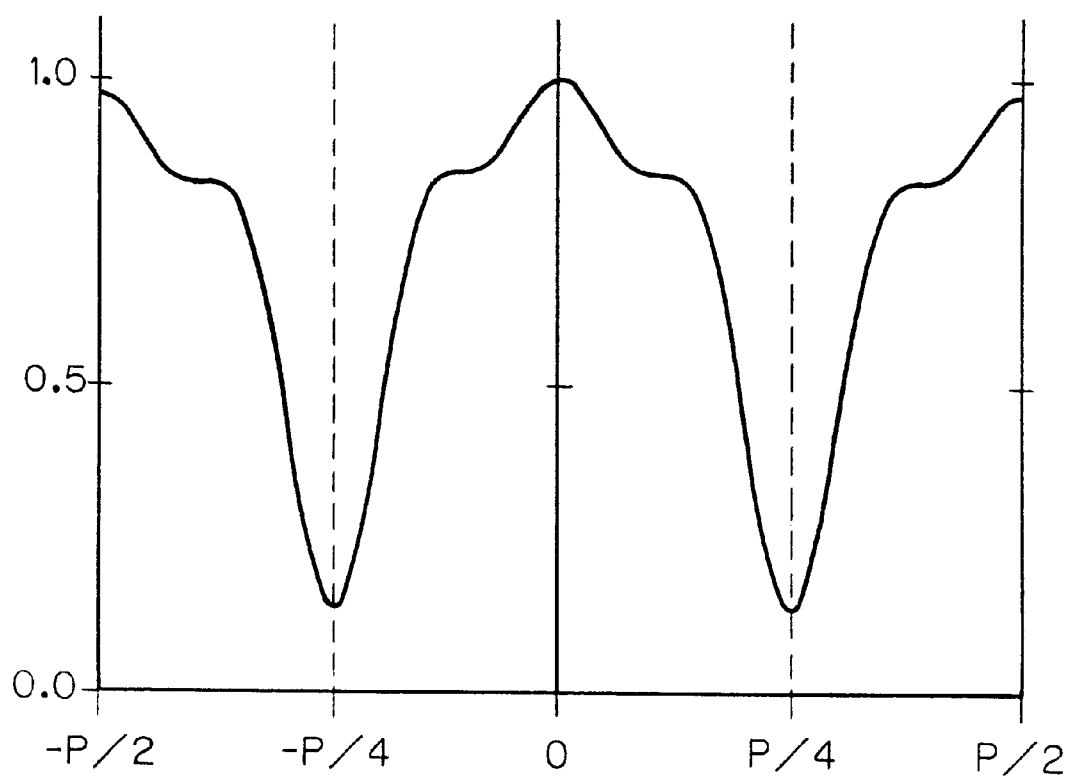
FIG. 6 shows a simulation result of an image of a position detection mark of low step, which is obtained by the position detecting apparatus according to the embodiment of the present invention.

FIG. 6 shows a simulation result for an image of a position detection mark having a step height of 5 nm, which was obtained by the position detecting apparatus according to this embodiment. Mark forming conditions were assumed as follows: The mark comprised recessed and projecting portions which were formed at a period of 12 µm such that the widths of the recessed and projecting portions were equal to each other. The mark surface was made of a uniform material (refractive index: 3.55), and it was coated with a photoresist having a refractive index of 1.68 and a thickness of 1 µm. It should be noted that the wave band of illuminating light ranged from 550 nm (=λ1) to 750 nm (=λ2), and that the inner and outer radii of the annular transmitting portion I of the illuminating light beam limiting member 6 were determined according to the above-described conditions (inequalities) as follows:

$$r_i=0.10 \geq \lambda 2/(2 \times P)=0.750/24=0.031$$

$$r_o=0.14$$

$$(r_o-r_i=0.04 \leq \lambda 1/P=0.550/12=0.046)$$

Further, the inner and outer radii of the annular light-blocking portion S of the image-forming light beam limiting member 16 were set equal to the inner and outer radii $r_i$ and $r_o$, respectively, of the annular transmitting portion I, and the numerical aperture $NA_o$ of the image-forming optical system was determined according to the above-described condition (inequality) as follows:

$$NA_o=0.22 \geq \lambda 2/P+r_o=0.750/12+0.14=0.203$$

FIG. 6 shows the image intensity distribution for one period of the position detection mark 11. The position 0 on the abscissa axis represents the center of the mark (recess), and the chain line at each of the positions +P/4 and −P/4 represents an edge (boundary between recessed and projecting portions of the mark). The intensity distribution plotted along the ordinate axis has been standardized so that the largest value of the image intensity in one period is 1.

Figure 7:
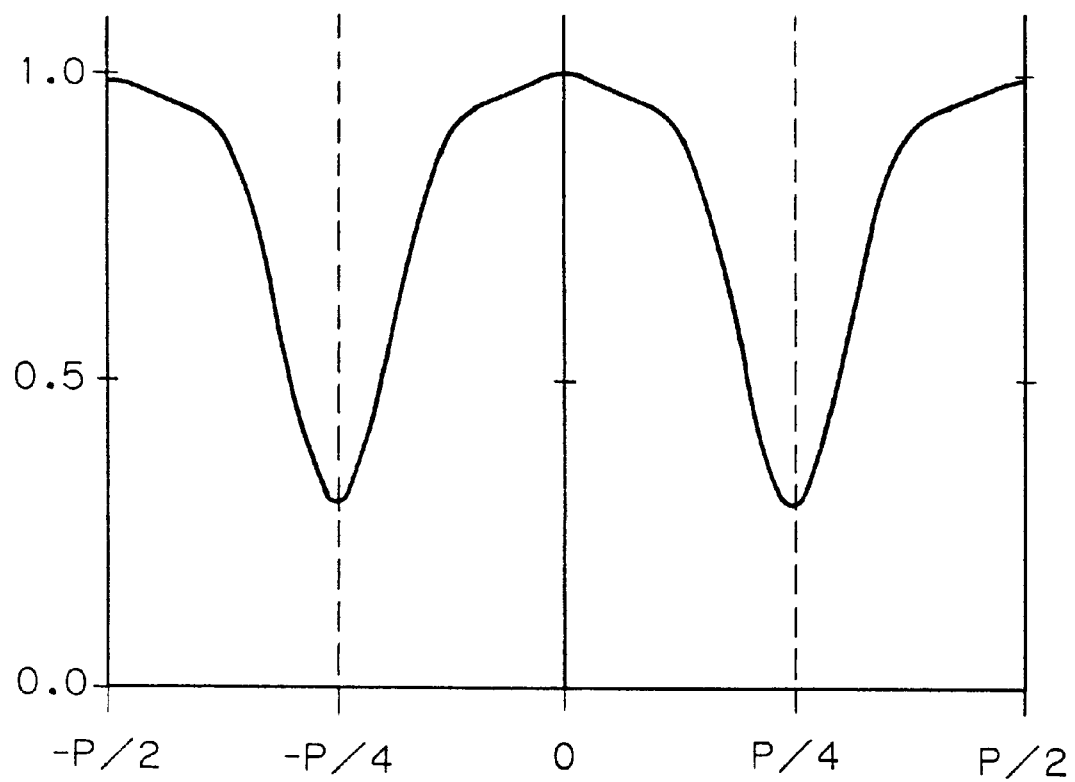
FIG. 7 shows a simulation result of an image of a position detection mark of low step, obtained under the same simulation conditions for the simulation result shown in FIG. 6 except the numerical aperture of an image-forming optical system.

FIG. 7 shows a result of a simulation performed under the same conditions as those for the simulation result shown in FIG. 6 except that the numerical aperture $NA_o$ was set at 0.18, that is, the system did not satisfy the above-described condition (12) for the numerical aperture $NA_o$. The mark image shown in FIG. 7 is slightly inferior to the image shown in FIG. 6 in the sharpness of the dark portions (i.e., the mark edge portions), but it has a sufficiently high contrast for detection of the edge position, that is, the mark position. Accordingly, it will be understood that it is not necessary to strictly satisfy the condition (12) for the numerical aperture $NA_o$ among the above-described conditions (10) to (12) in this embodiment.

Figure 8:
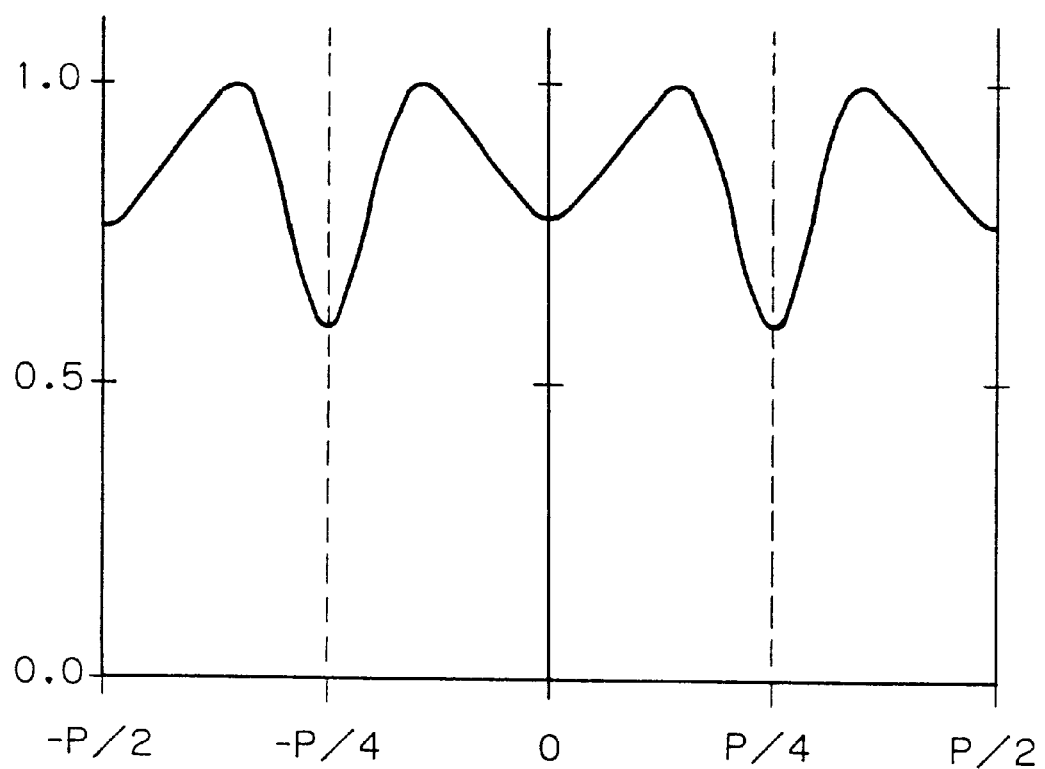
FIG. 8 shows a simulation result of an image of a position detection mark of low step, obtained under the same simulation conditions for the simulation result shown in FIG. 6 except the outer radius of an annular transmitting portion on an illumination system pupil plane.

FIG. 8 shows a result of a simulation performed under the same conditions as those for the simulation result shown in FIG. 6 except that the outer radius $r_o$ of the annular transmitting portion I was set at 0.18, that is, the system did not satisfy the above-described condition (10) for the outer radius $r_o$. In this case, the image contrast is markedly degraded in comparison to the images shown in FIGS. 6 and 7. Accordingly, it will be understood that no favorable detection accuracy can be obtained by position detection based on such an image.

Figure 9:
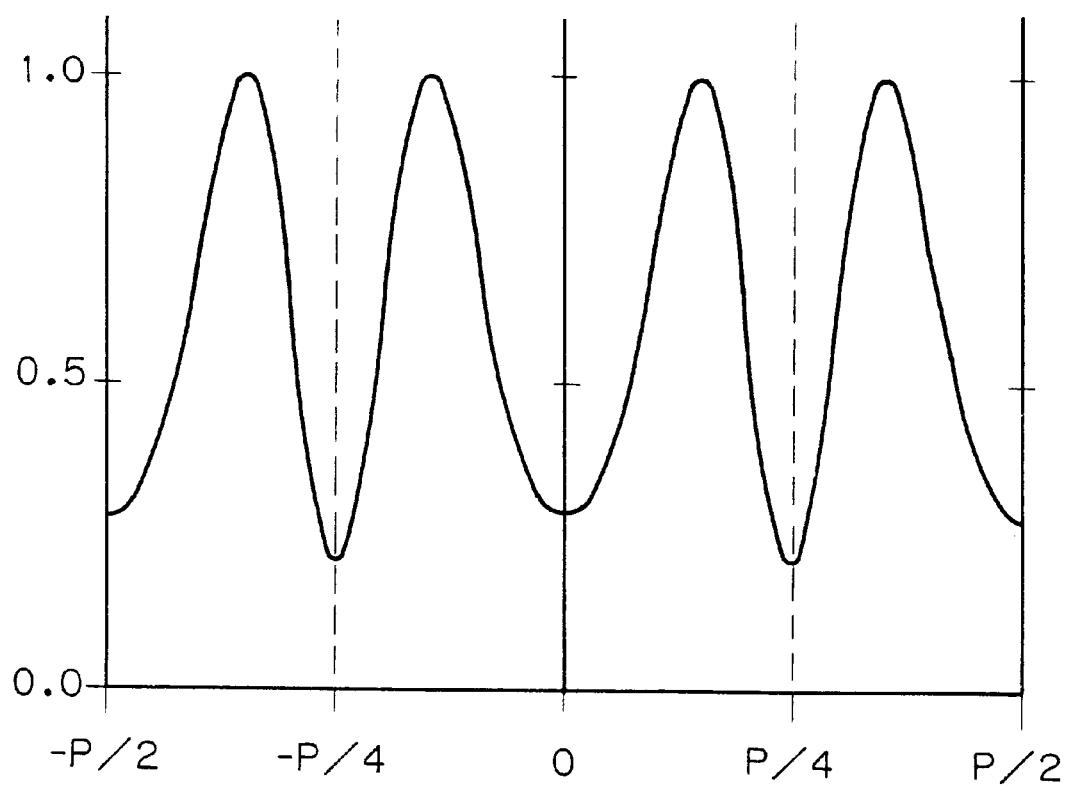
FIG. 9 shows a simulation result of an image of a position detection mark of low step, obtained under the same simulation conditions for the simulation result shown in FIG. 6 except the inner radius of the annular transmitting portion on the illumination system pupil plane.

FIG. 9 shows a result of a simulation performed under the same conditions as those for the simulation result shown in FIG. 6 except that the inner radius $r_i$ and outer radius $r_o$ of the annular transmitting portion I were set at 0.02 and 0.06, respectively, that is, the system did not satisfy the above-described condition (11) for the inner radius $r_i$, although it satisfied the condition (10) for the outer radius $r_o$. In this case, the image contrast is high, but dark portions are formed not only at the mark edges but also at the centers of the recessed and projecting portions, resulting in an image of a quadruple period. Such an image may cause the mark position to be erroneously detected by P/4 and is therefore difficult to use for position detection.

Figure 10:
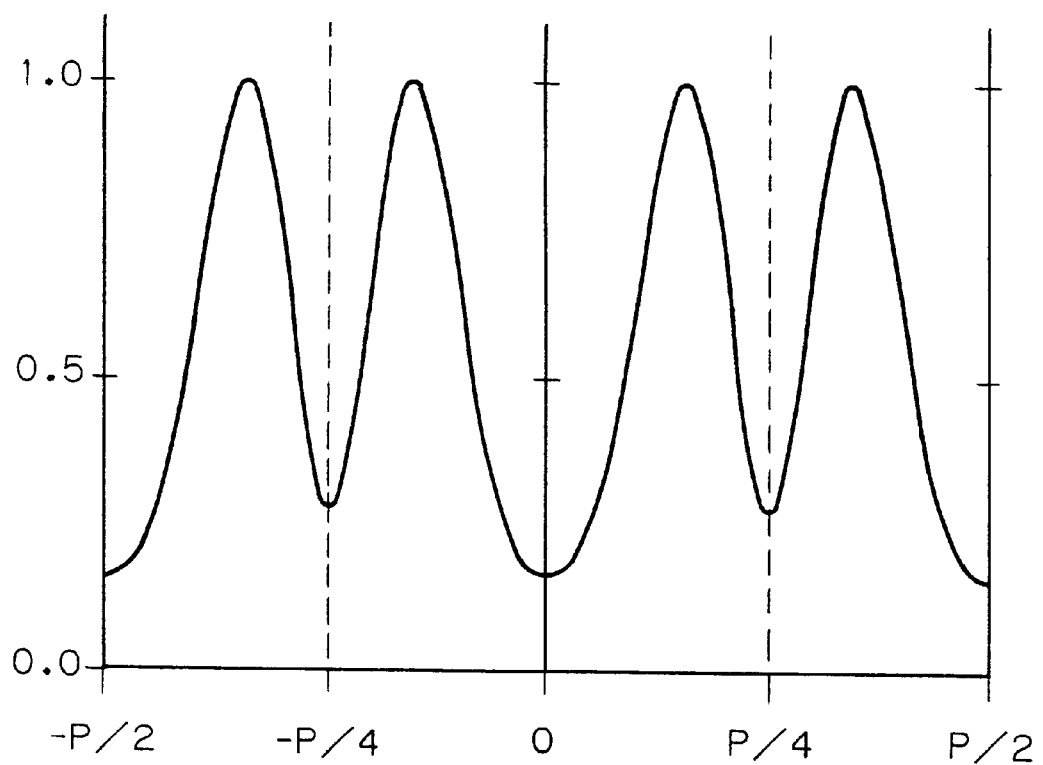
FIG. 10 shows a simulation result of an image of a position detection mark of low step, obtained when a transmitting portion on the illumination system pupil plane and a light-blocking portion on the image-forming system pupil plane are each formed as a circular portion.

FIG. 10 shows a result of a simulation performed under conditions different from those in FIGS. 6 to 9. That is, in the simulation shown in FIG. 10 the transmitting portion I of the illuminating light beam limiting member 6 was a circular portion (i.e., an ordinary σ stop) centered at the optical axis, and the light-blocking portion S of the image-forming light beam limiting member 16 was also a circular portion centered at the optical axis. It should be noted that both the radii of the transmitting portion I and light-blocking portion S were set at 0.66 (0.3 in terms of the σ value). The wave band, numerical aperture and other conditions were the same as those for the simulation result shown in FIG. 6. The image obtained in this case has a quadruple period similar to that of the image shown in FIG. 9 and is therefore difficult to use for position detection.

Figure 11:
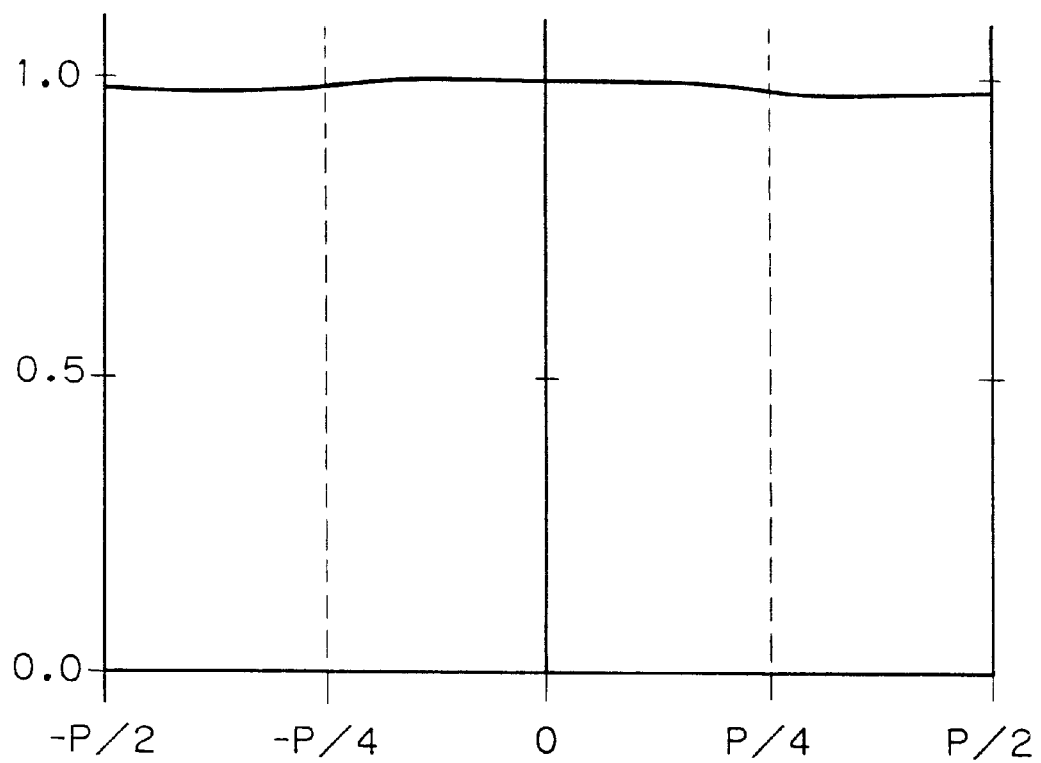
FIG. 11 shows a simulation result of an image of a position detection mark of low step, obtained with a bright-field microscope.

FIG. 11 shows an image obtained with an ordinary (bright-field) microscope. In this case, the radius of the σ stop was 0.176 (0.8 in terms of the σ value), and no light-blocking portion S was provided, as a matter of course. The other conditions were the same as those for the simulation result shown in FIG. 6. It will be clearly understood from FIG. 11 that, when a bright-field microscope is used for position detection of a mark having a low step height (5 nm), the obtained image has substantially no difference between bright and dark (i.e., contrast), and thus position detection cannot be effected.

Thus, in contrast to the images shown in FIGS. 8 to 11, the images shown in FIGS. 6 and 7, which are obtained by the position detecting apparatus according to this embodiment, have a sufficiently high contrast, and in the images the darkest portion coincides with a mark edge. Accordingly, a reliable position detection can be effected by using such a mark image.

It should be noted that the illuminating light beam limiting member 6 and image-forming light beam limiting member 16 in this embodiment are extremely useful for detection of a position detection mark having a low step, as has been described above, and that a position detection mark having a high step (e.g., 100 nm or more) can be detected with a sufficiently high accuracy even by a conventional position detecting apparatus. Therefore, when a mark of high step is to be detected, the illuminating light beam limiting member 6 and the image-forming light beam limiting member 16 may be withdrawn from the optical path by using the changing mechanisms (i.e., the movable members 7 and 17). When there is likelihood that the aberration condition of the optical system will be varied by withdrawal of the image-forming light beam limiting member 16 (or the illuminating light beam limiting member 6) made of a glass substrate, it is necessary to insert a transparent member having an optical thickness equal to the thickness of the image-forming light beam limiting member 16 (or the illuminating light beam limiting member 6) in place of it. This will be readily realized by arranging the changing mechanisms 7 and 17 so that the respective transparent members are retained by these mechanisms.

Incidentally, in the above-described embodiment the width D of each of a plurality of discrete secondary light sources formed by the illuminating light beam limiting member 6 and the width of the light-blocking portion of the image-forming light beam limiting member 16, which is conjugate to the secondary light sources, are determined by the wave band (λ1 to λ2) of the illuminating light beam. In this case, when a wavelength selecting device, e.g., a sharp-cut filter, is inserted between the position detection mark 11 and the imaging device 28, for example, or when the spectral sensitivity of the imaging device 28 is narrower than the wave band of the illuminating light beam, the width D of the secondary light sources and the width of the light-blocking portion should be determined by taking into consideration the above-described matters, that is, on the basis of a wave band which actually contributes to the formation of an image signal of the position detection mark 11.

Although the illuminating light beam limiting member 6 used in the foregoing embodiment is adapted to transmit only a light beam within the annular transmitting portion I among light beams distributed over the illumination system pupil plane and to block the other light beams, the arrangement may be such that the illuminating light beam is converged onto the annular area on the illumination system pupil plane by using, for example, an optical fiber bundle or a combination of a concave conical prism and a convex conical prism. In this case, the loss of light quantity is reduced to a considerable extent, advantageously. It is also possible to use a laser, e.g., a semiconductor laser, as the light source 1 for illumination. In this case also, it is desirable for the illuminating light beam to have a certain wave band, and it is therefore preferable to use a laser which oscillates at a multiplicity of wavelengths, e.g., a dye laser, or to use a plurality of lasers which oscillate at different wavelengths.

Further, the arrangement may be such that the changing mechanism 7 is provided with a plurality of aperture stops which differ from each other in at least one of the outer and inner radii of the annular transmitting portion I, that is, which differ from each other in at least either the radial width (annular ratio) or position of the annular transmitting portion I, and one of the aperture stops is interchangeably disposed in the illumination optical path. In this case, it is possible to select an appropriate aperture stop which satisfies the above-described conditions (10) and (11) in accordance with a change in the degree of fineness (period P) of the position detection mark 11 and to dispose the selected aperture stop in the illumination optical path. Accordingly, it is possible to obtain a mark image of high contrast at all times independently of the period of the position detection mark 11. It should be noted that the outer and inner radii of the annular transmitting portion I need not be changed in accordance with a change of the period of the position detection mark 11, and that the outer and/or inner radius of the annular transmitting portion I may be changed only when the image contrast or fidelity is degraded by a change of the period of the position detection mark 11 to such an extent that the desired position detection accuracy cannot be obtained.

Further, the changing member 7 having a plurality of aperture stops may be replaced by an aperture stop which is formed, for example, by a liquid crystal device or an electrochromic device, and which is placed at the illumination system pupil plane. In this case, it is possible to change the shape, size and position of the transmitting portion I on the illumination system pupil plane as desired. Further, a concave conical prism and a convex conical prism may be combined together to form an annular illuminating light beam distribution (or light intensity distribution) which satisfies the above-described conditions (10) and (11) over the illumination system pupil plane. In this case, the two prisms may be arranged to be movable relative to each other in the optical axis direction so as to change the radial position of the annular illuminating light beam distribution (light intensity distribution). It is also possible to dispose a zoom lens system between the light source 1 and the two prisms so as to change the diameter (size) of the illuminating light beam incident on the light source-side conical prism, thereby changing the radial width of the annular illuminating light beam distribution (light intensity distribution).

It should be noted that the area on the illumination system pupil plane other than the annular transmitting portion I need not completely be shielded from light, and that the area other than the annular transmitting portion I may be given a predetermined transmittance, that is, the area other than the annular transmitting portion I may be formed as a light-reducing portion, provided that the desired position detection accuracy can be obtained even if the image contrast or fidelity is slightly degraded. In other words, it is only necessary to make the illuminating light intensity distribution over the illumination system pupil plane higher in an annular area that satisfies the conditions (10) and (11) than in the other area.

Further, the arrangement may be such that the changing mechanism 17 is provided with a plurality of aperture stops which differ from each other in at least one of the outer and inner radii of the annular light-blocking portion S on the image-forming system pupil plane, that is, which differ from each other in at least either the radial width (annular ratio) or position of the annular light-blocking portion S, and one of the aperture stops is interchangeably disposed in the image-forming optical path. In this case, even when at least one of the outer and inner radii of the annular transmitting portion I changes in accordance with the period of the position detection mark 11, as described above, it is possible to select an aperture stop most suitable for the annular transmitting portion I after the change of its outer and/or inner radius and to dispose the selected aperture stop in the image-forming optical path. Accordingly, it is possible to block unwanted zeroth-order diffracted light and enable useful diffracted light other than the zeroth-order diffracted light, which contributes to the image formation, to enter the imaging device 28 efficiently at all times. It should be noted that the width and position of the annular light-blocking portion S on the image-forming system pupil plane need not be changed in accordance with a change of the outer and/or inner radius of the annular transmitting portion I on the illumination system pupil plane, and that the masking width and/or position of the annular light-blocking portion S may be changed only when the image contrast or fidelity is degraded by a change of the outer and/or inner radius of the annular transmitting portion S to such an extent that the desired position detection accuracy cannot be obtained.

It should be noted that the annular light-blocking portion S on the image-forming system pupil plane may be formed as a light-reducing portion having a predetermined transmittance, provided that the desired position detection accuracy can be obtained even if the image contrast or fidelity is slightly degraded.

Although in this embodiment both the transmitting portion I and the light-blocking portion S have annular shapes, the portions I and S may have another shape, for example, a rectangular, square or polygonal (particularly, regular polygonal) shape. Further, the light-transmitting area on the illumination system pupil plane may be partially shielded (or formed as a light-reducing portion). That is, the light-transmitting area may comprise a plurality of partial areas (having any desired shape, e.g., a circular-arc shape, a circular shape, or a straight-line shape). Correspondingly, the light-blocking area on the image-forming system pupil plane may be formed in the same shape as the light-transmitting area. Alternatively, the light-blocking area may be formed in the shape of an annular ring, a rectangle, a polygon, etc. substantially containing a plurality of partial areas which are in image-forming relation to the light-transmitting area. It should be noted that, in the case where the annular transmitting portion on the illumination system pupil plane is square, each value should be determined so as to satisfy the conditions (10) and (11) by regarding the distance between the inner edge of the square transmitting portion and the optical axis as the above-described inner radius $r_i$ and the distance between the outer edge of the square transmitting portion and the optical axis as the outer radius $r_o$. However, the numerical aperture $NA_o$ of the image-forming optical system is desirably set larger than the numerical aperture determined from the condition (12).

Figure 12:
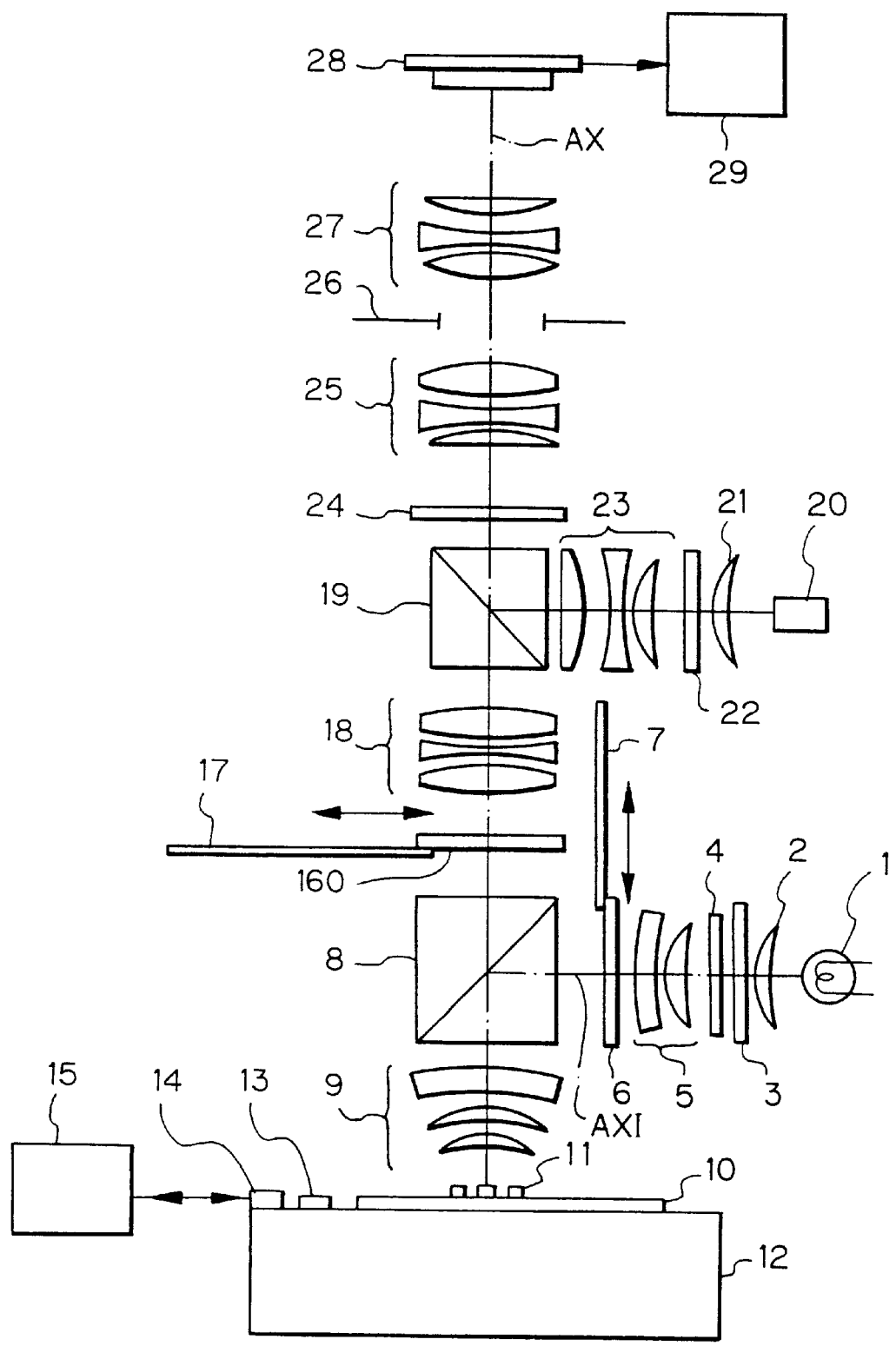
FIG. 12 schematically shows the whole arrangement of a position detecting apparatus according to another embodiment of the present invention.

Next, another embodiment of the present invention will be described with reference to FIG. 12. The arrangement of a position detecting apparatus shown in FIG. 12 is almost the same as that of the apparatus shown in FIG. 1. In FIG. 12, a phase-contrast member (phase-contrast filter) 160 is provided in place of the image-forming beam limiting member 16 shown in FIG. 1. The apparatus shown in FIG. 12 differs from the apparatus shown in FIG. 1 only in the above-described structural feature. Accordingly, discrip-tion of the portions or members having the same arrangements as those shown in FIG. 1 is omitted, and the following description centers on the phase-contrast filter 160. It should be noted that in FIG. 12 the same components as those shown in FIG. 1 are denoted by the same reference characters.

Referring to FIG. 12, a light beam reflected from the wafer 10 (i.e., the position detection mark 11) reaches a phase-contrast member (phase-contrast filter) 160 according to the present invention through the objective lens unit 9 and the beam splitter 8. The phase-contrast filter 160 is placed at an image-forming system pupil plane relative to the surface of the wafer 10 (i.e., the position detection mark 11) with respect to the objective lens unit 9 and the beam splitter 8. Accordingly, the amount of positional displacement of a predetermined point in the phase-contrast filter 160 from the optical axis AX of the image-forming optical system is proportional to the sine of the exit angle to the surface of the wafer 10 of a light beam (image-forming light beam) passing through the predetermined point.

The arrangement of the phase-contrast filter 160 will be detailed later. The phase-contrast filter 160 is retained by the movable member 17 such that the center of the phase-contrast filter 160 coincides with the optical axis AX of the image-forming optical system. The movable member 17 is, for example, a turret plate or a slide, which enables the phase-contrast filter 160 to be inserted into and withdrawn from the optical path of the image-forming optical system. Accordingly, in this embodiment, phase-contrast detection and bright-field detection can be switched over from one to the other by the movable member 17, and thus it is possible to select either of the two different detection modes according to the step height of the position detection mark 11. For example, when a position detection mark of low step is to be detected, the phase-contrast detection mode is selected, and the phase-contrast filter 160 is inserted into the optical path; when a position detection mark of high step is to be detected, the bright-field detection mode is selected, and the phase-contrast filter 160 is withdrawn from the optical path.

The image-forming light beam passing through the phase-contrast filter 160 passes through the lens system 18 and the beam splitter 19 and forms an image of the position detection mark 11 on the index board 24.

Incidentally, the following problems are experienced in relation to the illumination of the index board 24: For example, insertion, withdrawal or replacement of the illuminating light beam limiting member 6 by the movable member 7 causes a change in the light quantity of the image-forming light beam from the position detection mark 11, which enters the imaging device 28. Consequently, the mark image and the fiducial index image, which are formed on the imaging device 28, differ from each other in the intensity (brightness). As the intensity difference increases, it becomes likely that the accuracy of positional displacement detection in the image processing system 29 will be degraded. Therefore, in this embodiment, the intensity of light emitted from the light source 20 to illuminate the fiducial indexes is made adjustable according to the change in light quantity of the image-forming light beam so that the intensity of the position detection mark image and the intensity of the fiducial index image, which are formed on the imaging device 28, are approximately equal to each other at all times. In this embodiment, the intensity of light emitted from the light source (light-emitting diode) 20 is controlled by controlling the electric current supplied to the light source 20. For example, when the illuminating light beam limiting member 6 is withdrawn from the optical path of the illumination optical system, the intensity of light emitted from the light source 20 is increased. The arrangement may be such that a member (e.g., a turret plate, a slider, etc.) which retains a plurality of light-reducing filters having different transmittances is provided between the light source 20 and the index board 24, and one of the light-reducing filters is interchangeably disposed in the optical path by driving the retaining member. Insertion, withdrawal or replacement of the illuminating light beam limiting member 6 and the phase-contrast filter 160 is automatically performed by a controller which controls the whole apparatus shown in FIG. 12 on the basis of information (i.e., the period and step height of the position detection mark 11, etc.) from an input device (e.g., a keyboard). Further, the controller controls the intensity of light emitted from the light source 20 according to the types of illuminating light beam limiting member 6 and phase-contrast filter 160 and also according to whether these members are present or not.

Figure 13A:
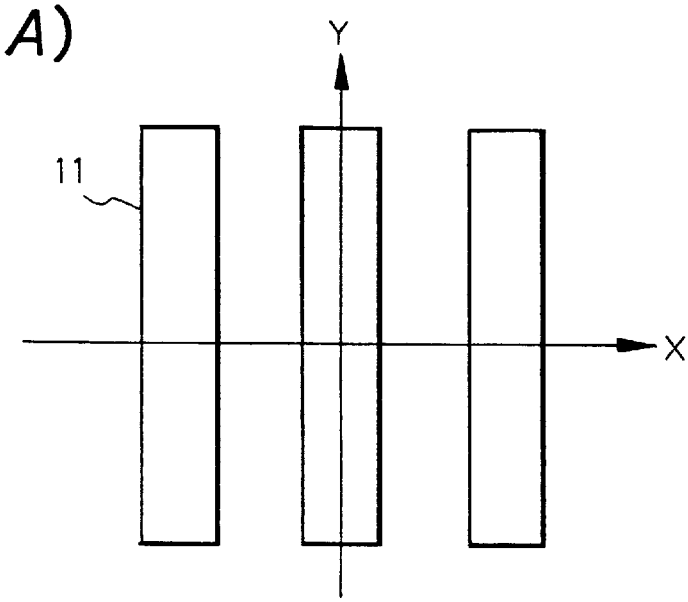
FIGS. 13(A) and 13(B) show a specific arrangement of a position detection mark.
Figure 13B:
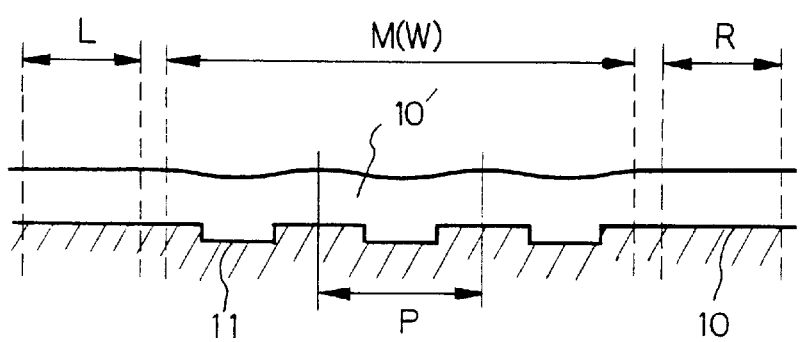

The shapes of transmitting portions and other arrangements of the index board 24, the index board illumination field stop 22 and the illumination field stop 4 and the relationship between these three members are the same as those shown in FIGS. 3(A) to 3(C), which have been described in regard to the first embodiment. FIG. 13(A) is a top plan view of the position detection mark 11, and FIG. 13(B) is a sectional view taken in the position measuring direction in FIG. 13(A) (i.e., the direction X in FIG. 13(A)). As will be clear from these figures, the form of the position detection mark 11 is also the same as that in the first embodiment.

Figure 13C:
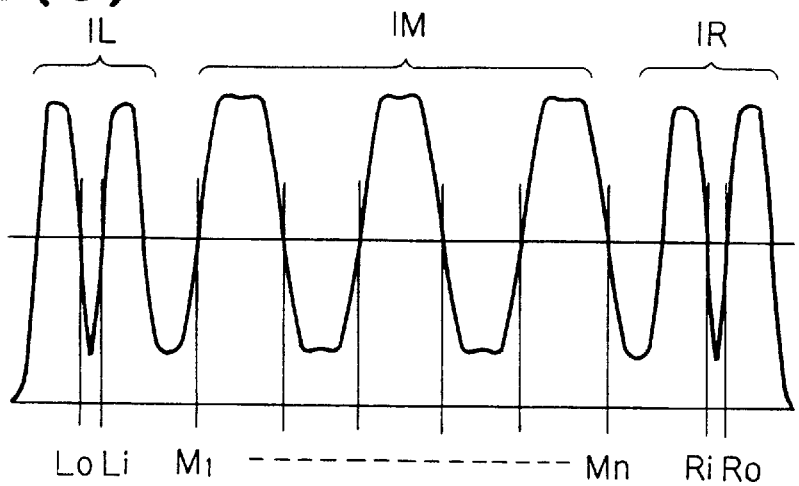
FIG. 13(C) shows intensity distributions of images formed on an imaging device.

Thus, intensity distributions of images formed on the imaging device 28 are as shown in FIG. 13(C). That is, an image IM of the position detection mark 11 illuminated by illuminating light from the light source (halogen lamp) 1 is formed in the center, and images (dark images) IL and IR of the fiducial indexes 24L and 24R illuminated by illuminating light from the light source (light-emitting diode) 20 are formed at the left and right of the position detection mark image IM. This image intensity distribution is, however, different from that shown in FIG. 4(C), which has been described in regard to the first embodiment.

The image processing system 29 calculates a positional relationship between the image IM of the position detection mark 11 and the images IL and IR of the fiducial indexes 24L and 24R on the basis of a light intensity signal such as that shown in FIG. 13(C), which is output from the imaging device 28. The calculating process is the same as the processing which is generally executed in the conventional imaging type position detection.

It is necessary to measure a positional relationship of the fiducial indexes 24L and 24R, which are used as references for a detected position, to the wafer 10 (i.e., the wafer stage 12) prior to the above-described position detection. This processing is executed by the base line check, which has been set forth in the description of the first embodiment.

When the present invention is applied to a position detecting system (i.e., alignment system) of a projection exposure system, each shot area on a wafer is moved to a position under a projection optical system (not shown) on the basis of the above-described position detection value and exposure shot array data stored in the projection exposure system, and overlay exposure is carried out for each shot area.

Next, the illuminating light beam limiting member 6 and the phase-contrast filter 160 in this embodiment will be explained on the assumption that a position detection mark 11 having a period of 8 $\mu$m is illuminated with an illuminating light beam in a wave band of 550 nm to 750 nm to detect the position of the mark 11.

Figure 14A:
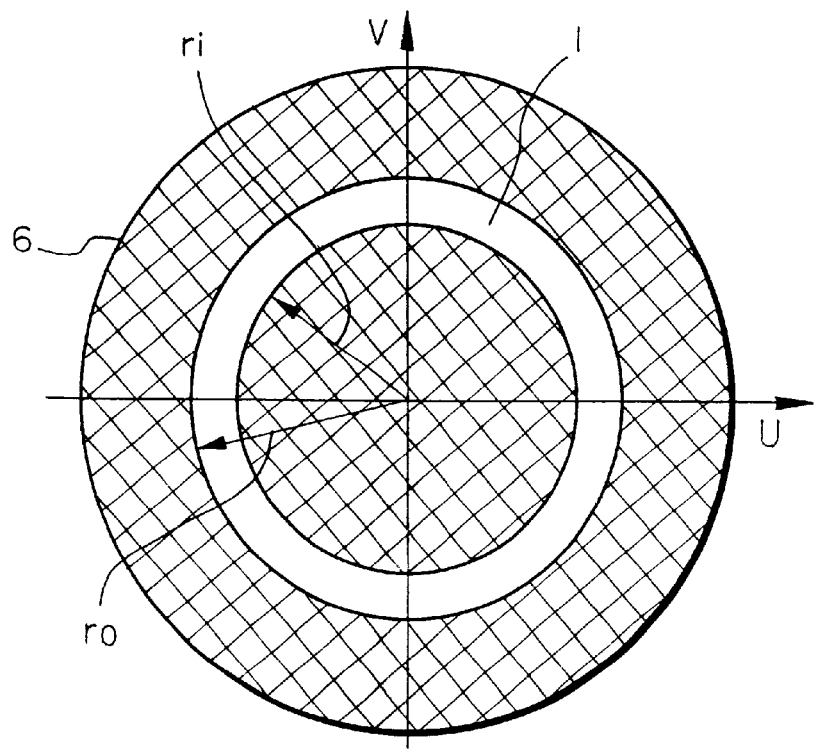
FIG. 14(A) shows a specific arrangement of a illuminating light beam limiting member.
Figure 14B:
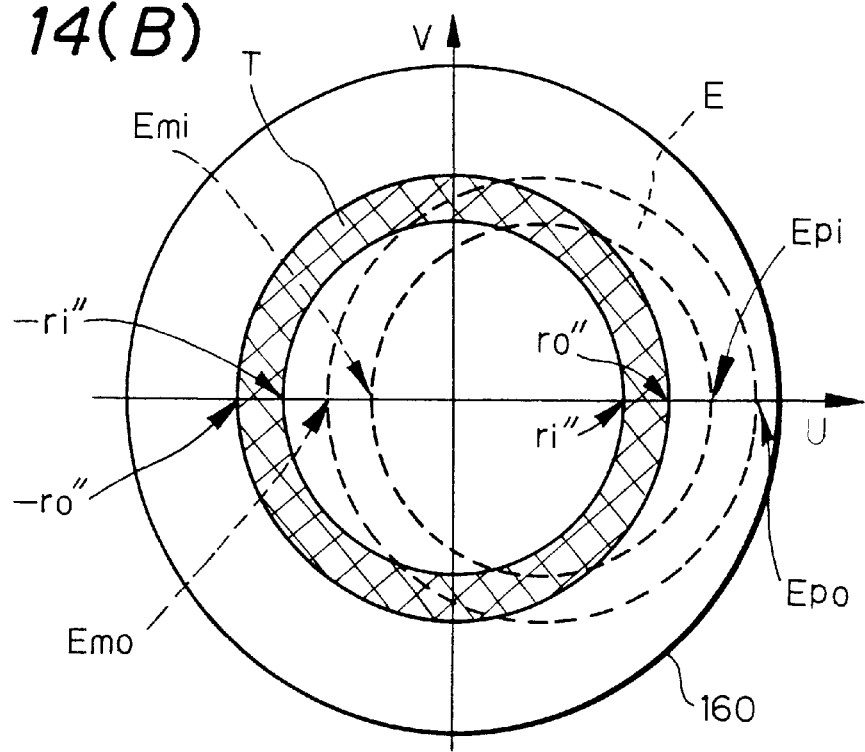
FIG. 14(B) shows a specific arrangement of a phase-contrast filter.

FIGS. 14(A) and 14(B) respectively show the arrangements of the illuminating light beam limiting member 6 and the phase-contrast filter 160, which are suitable for the above-described conditions. In the figures, the directions of U- and V-axes are equivalent to the X- and Y-axis directions of the position detection mark 11 shown in FIG. 13(A).

As shown in FIG. 14(A), the illuminating light beam limiting member 6 comprises a light-blocking substrate having an annular transmitting portion I which is centered at the optical axis (i.e., the intersection between the U- and V-axes) of the illumination optical system (1 to 9), and which has an inner radius $r_i$ of 0.16 (in terms of numerical aperture, that is, the sine of the incident angle to the position detection mark 11 of a light beam passing through a predetermined point on a circle with a radius $r_i$; the same shall apply hereinafter) and an outer radius $r_o$ of 0.20, in the same way as in the first embodiment. The illuminating light beam limiting member 6 may be a metal light-blocking plate having an annular aperture provided in a specific part thereof. Alternatively, the illuminating light beam limiting member 6 may be prepared by forming a light-blocking film of a metal or the like on a transparent substrate of glass or the like and removing the film from a specific part.

Figure 15:
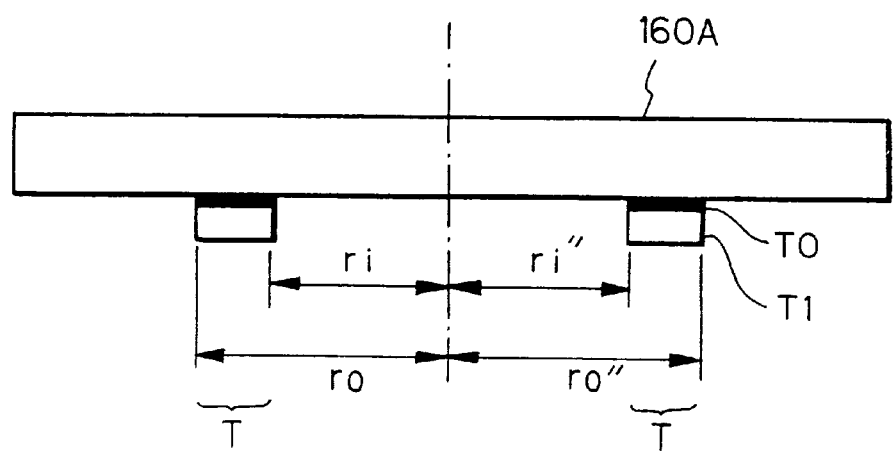
FIG. 15 is a sectional view of a phase-contrast filter according to the second embodiment of the present invention.

The phase-contrast filter 160 has an annular phase difference imparting portion T (the shaded portion in FIG. 14(B)) which is formed at a position conjugate to the annular transmitting portion I of the illuminating light beam limiting member 6 so that the annular phase difference imparting portion T is in image-forming relation to the annular transmitting portion I. FIG. 15 is a sectional view taken along the U-axis in FIG. 14(B). As shown in FIG. 15, the phase-contrast filter 160 is formed by stacking a metal thin film $T_0$ and a dielectric film $T_1$ on the surface of a transparent substrate 160A of glass or the like so that the intensity of light passing through the transparent substrate 160A is reduced by the metal thin film $T_0$, and the phase of the transmitted light is shifted by the dielectric film $T_1$. Accordingly, the image-forming light beam from the position detection marks 11 which are distributed over the phase difference imparting portion T and the image-forming light beam distributed over the area other than the phase difference imparting portion T differ in phase from each other, that is, a predetermined phase difference is given between the two light beams. The arrangement of the phase-contrast filter 160 is similar to that of a phase-contrast filter used in a conventional phase-contrast microscope, or that of a "halftone phase shift reticle" which has recently begun to be used in photolithography processes. Accordingly, the phase-contrast filter 160 can be produced by using one of various methods for producing such conventional phase-contrast filters or halftone phase shift reticles.

The most favorable phase difference that is to be given to the transmitted light by the metal thin film $T_0$ and the dielectric film $T_1$ is $\pi/2$ [rad] (i.e., ¼ wavelength) or so. Therefore, the thickness of the dielectric film $T_1$ should be set at $\lambda/(4(n-1))$ or so, where n is the refractive index of the dielectric film $T_1$, and $\lambda$ is the center wavelength (650 m in the example shown in FIG. 15) of a light beam which contributes to the image formation in the illuminating light. However, since the image contrast of the position detection mark 11 will not rapidly reduce even if there is a slight error in the amount of phase difference (phase shift quantity) given by the phase difference imparting portion T, the phase difference which should be given to the transmitted light by the phase difference imparting portion T is allowed to vary within the range of $\pi/2 \pm \pi/4$ [rad]; it is possible to obtain an image of relatively favorable contrast which enables position detection of high accuracy as long as the phase difference given by the phase difference imparting portion T falls within the above range. If the phase difference can be controlled within about $\pi/2 \pm \pi/6$ [rad] in particular, it is possible to obtain an image of even more favorable contrast.

In a case where the wave band of the light beam contributing the image formation is narrow (that is, the illuminating light is substantially close to monochromatic light), the thickness of the dielectric film $T_1$ may be $(2k+1)\lambda/(4(n-1))$, i.e., $(2k+1)\pi/4$[rad] in terms of the phase difference, (where k is a natural number). In a case where the wave band of the light beam contributing to the image formation is wide, on the other hand, for a wavelength other than the center wavelength the phase difference further deviates from $(2k+1)\pi/4$ [rad] (the most favorable condition) as k becomes larger. Therefore, in such a case the thickness of the dielectric film $T_1$ should be set at $\lambda/(4(n-1))$. The use of the phase-contrast filter 160 that satisfies these conditions makes it possible to obtain a mark image of sharp contrast in which the recesses of the position detection mark 11 are bright, while the projections thereof are dark.

The phase-contrast filter 160 may be arranged such that only a metal thin film $T_0$ is formed on the phase difference imparting portion T of the transparent substrate 160A, and a dielectric film $T_1$ is formed on the other area of the substrate 160A. In this case, the phase of the zeroth-order diffracted light leads diffracted light of other orders by $\pi/2$ [rad]. Therefore, unlike the image of the position detection mark 11 obtained by using the phase-contrast filter 160 shown in FIG. 15, the position detection mark image obtained in this case shows a light intensity profile in which the recesses of the position detection mark 11 are dark, while the projections thereof are bright. However, in the two cases, the image contrasts are equal to each other and high, as a matter of course.

Further, the phase difference imparting portion T does not necessarily need to have a light-reducing action. In a case where the phase difference imparting portion T has no light-reducing action, the metal thin film $T_o$ need not be added. To give a phase difference, the transparent substrate 160A may be etched instead of forming the dielectric film $T_1$.

The phase difference imparting portion T has an inner radius $r_i'$ of 0.15 and an outer radius $r_o'$ of 0.21 so as to be slightly larger than the annular transmitting portion I of the illuminating light beam limiting member 6. The reason why the phase difference imparting portion T is made larger than the annular transmitting portion I is to give the above-described phase difference to the zeroth-order diffracted light from the position detection mark 11 even more surely in consideration of the fact that zeroth-order diffracted light slightly spreads on the phase-contrast filter 160. The image-forming optical system is assumed to have a numerical aperture $NA_o$ (radius of the image-forming system pupil plane) of 0.30. It should be noted that in FIG. 12 the aperture stop 26, which determines an actual numerical aperture, is disposed not at the same position as the phase-contrast filter 160 but at a position conjugate to it; in a case where the numerical aperture of the aperture stop 26 is reduced to a value smaller than the numerical aperture of the objective lens unit 9, the numerical aperture $NA_o$ represents the numerical aperture (effective numerical aperture) of the aperture stop 26. Further, the radius of the outer periphery of the illuminating light beam limiting member 6 is sufficiently larger than the numerical aperture of the illumination optical system (i.e., the radius of the illumination system pupil plane), so that transmitted light which is distributed outside the annular transmitting portion I cannot reach the position detection mark 11, as a matter of course.

FIG. 14(B) shows a distribution (an area E surrounded by two chain-line circles in the figure) over the phase-contrast filter 160 of one first-order diffracted light generated from the position detection mark 11 by illumination with illuminating light passing through the annular transmitting portion I of the illuminating light beam limiting member 6 shown in FIG. 14(A). It should be noted that zeroth-order diffracted light among diffracted light beams from the position detection mark 11 is distributed over the phase difference imparting portion T which is conjugate to (and one size larger than) the annular transmitting portion I, where the intensity of the zeroth-order diffracted light is reduced by the metal thin film $T_0$, and the predetermined phase difference is given to the light by the dielectric film $T_1$. Although diffracted light beams of other orders are also distributed in actuality, consideration is herein given to only the zeroth- and first-order diffracted light beams, which play a dominant role in forming the image of the position detection mark 11.

Incidentally, a part of the first-order diffracted light is reduced by the phase difference imparting portion T, as shown in FIG. 14(B). In this embodiment, however, the reduction of the first-order diffracted light and addition of a phase difference thereto by the phase difference imparting portion T are minimized because the inner radius $r_i$ and outer radius $r_o$ of the annular transmitting portion I have been appropriately determined, as shown in FIG. 14(A). The reason for this will be explained below.

First of all, U coordinates of intersections between the U-axis and the inner and outer peripheries of the phase difference imparting portion T are $r_i"$ and $r_o"$ (and $-r_i"$ and $-r_o"$), respectively. Assuming that U coordinates of the intersections between the U-axis and the boundaries (i.e., the two chain-line circles) of the area E where the first-order diffracted light is distributed are $E_{pi}$, $E_{po}$, $E_{mi}$ and $E_{mo}$, respectively, the values of these U coordinates are given by $E_{pi}=\lambda/P+r_i$, $E_{po}=\lambda/P+r_o$, $E_{mi}=\lambda/P-r_i$, $E_{mo}=\lambda/P-r_o$ It will be clear from FIG. 14(B) that, when the value of $E_{pi}$ is smaller than $r_o"$, or the value of $E_{mo}$ is smaller than $-r_i"$, in particular, the degree to which the first-order diffracted light is reduced by the phase difference imparting portion T increases. When the value of $E_{mi}$ is larger than $r_i"$ also, the reduction of the first-order diffracted light similarly increases.

In the example shown in FIG. 14(A) also, the period P of the position detection mark 11 is 8 μm, and the inner radius $r_i$ and outer radius $r_o$ of the annular transmitting portion I are 0.16 and 0.20, respectively. In the range of wavelength λ of illuminating light, the shortest wavelength λ1 is 550 nm, and the longest wavelength λ2 is 750 nm. Therefore, when λ=λ1, the smallest value of $E_{pi}$ is given by $E_{pi}=\lambda1/P+r_i=0.23$ (13)

Thus, the smallest value of $E_{pi}$ is larger than $r_o"$ (=0.21). When λ=λ1, the smallest value of $E_{mo}$ is given by $E_{mo}=\lambda1/P-r_o=-0.13$ (14)

Thus, the smallest value of $E_{mo}$ is larger than $-r_i"$ (=-0.15).

Further, when λ=λ2, the largest value of $E_{mi}$ is given by $E_{mi}=\lambda2/P-r_i=-0.07$ (15)

Thus, the largest value of $E_{mi}$ is smaller than $r_i"$ (=0.15). Accordingly, the degree to which the first-order diffracted light is reduced by the phase difference imparting portion T reduces. Conditions for minimizing the reduction of the first-order diffracted light by the phase difference imparting portion T may be generalized as follows:

$E_{pi}=\lambda1/P+r_i \geq r_o"$ (16)

$E_{mo}=\lambda1/P-r_o \geq -r_i"$ (17)

$E_{mi}=\lambda2/P-r_i \leq r_i"$ (18)

Further, the outer radius $r_o"$ of the phase difference imparting portion T is larger than the outer radius $r_o$ of the annular transmitting portion I, and the inner radius $r_i"$ of the phase difference imparting portion T is smaller than the inner radius $r_i$ of the annular transmitting portion I. Accordingly, the above inequalities (16) to (18) may be rewritten as follows:

$E_{pi}=\lambda1/P+r_i \geq r_o$ (19)

$E_{mo}=\lambda1/P-r_o \geq -r_i$ (20)

$E_{mi}=\lambda2/P-r_i \leq r_i$ (21)

Particularly, both the inequalities (19) and (20) are equivalent to $r_o-r_i \leq \lambda1/P$ (22)

The inequality (21) is equivalent to $r_i \geq \lambda2/(2 \times P)$ (23)

Accordingly, it is, generally, possible to minimize the degree to which the first-order diffracted light is reduced by the phase difference imparting portion T when the inner radius $r_i$ and outer radius $r_o$ of the annular transmitting portion I satisfy the inequalities (22) and (23).

Incidentally, there is likelihood that the first-order diffracted light will be not only reduced by the phase difference imparting portion T but also blocked by restriction with the numerical aperture $NA_o$ of the image-forming optical system, depending upon the value of the numerical aperture $NA_o$. To avoid the occurrence of this problem, it is desirable that the value of $E_{po}=\lambda/P+r_o$ should be not larger than the numerical aperture $NA_o$. When λ=λ2, the largest value of $E_{po}$ is $\lambda2/P+r_o$. Accordingly, in this embodiment also, it is desirable for the numerical aperture $NA_o$ to satisfy the following condition:

$NA_o \geq \lambda2/P+ro$ (24)

Although in the foregoing description notice is taken of only first-order diffracted light which is generated on one side (in the direction +U) of zeroth-order diffracted light, it should be noted that the same is true of first-order diffracted light generated in the opposite direction (-U), and that the above-described conditions (inequalities) also hold for the first-order diffracted light generated in the direction -U. Further, it should be noted that the period P of the position detection mark 11 and the wave band (λ1 and λ2) of illuminating light beam are not necessarily limited to the above-mentioned values, and that the above-described conditions (inequalities) also hold for other values of the period P and the wave band.

Next, the effect of the position detecting apparatus according to this embodiment will be explained on the basis of a simulation result for an image of a position detection mark having an extremely small height difference between the recessed and projecting portions of the mark (i.e., step height).

Figure 16:
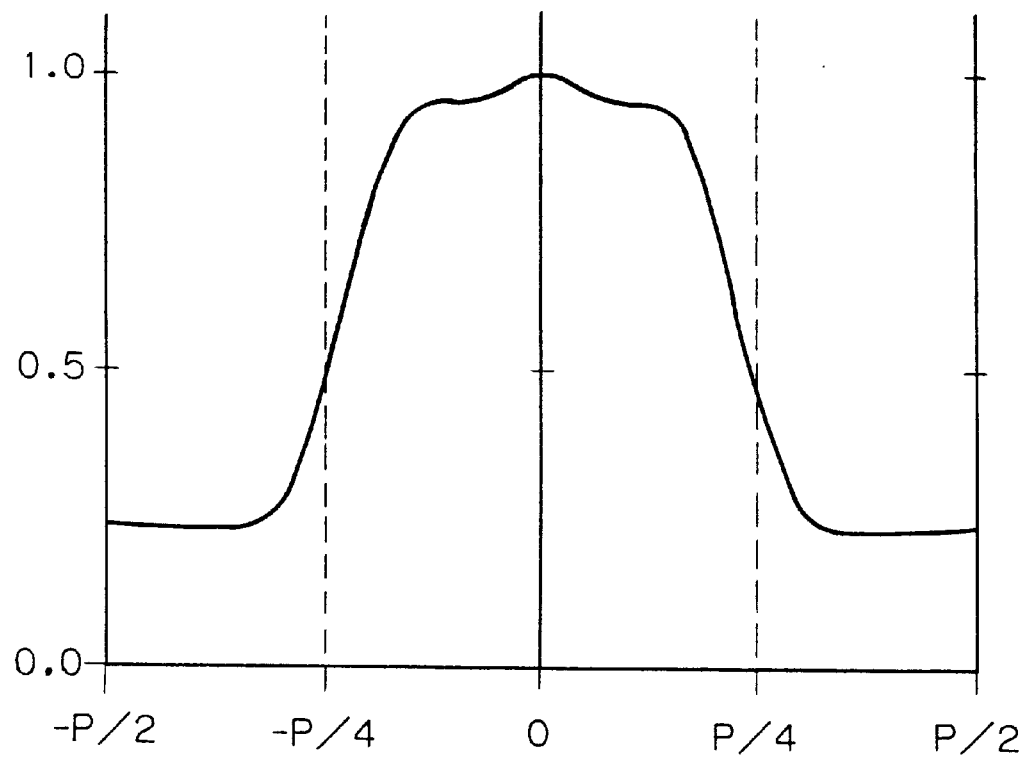
FIG. 16 shows a simulation result of an image of a position detection mark of low step, which is obtained by the position detecting apparatus according to the second embodiment of the present invention.

FIG. 16 shows a simulation result for an image of a position detection mark having a step height of 5 nm, which was obtained by the position detecting apparatus according to this embodiment. Mark forming conditions were assumed as follows: The mark comprised recessed and projecting portions which were formed at a period of 12 $\mu$m such that the widths of the recessed and projecting portions were equal to each other. The mark surface was made of a uniform material (refractive index: 3.55), and it was coated with a photoresist having a refractive index of 1.68 and a thickness of 1 $\mu$m. It should be noted that the wave band of illuminating light ranged from 550 nm (=$\lambda$1) to 750 nm (=$\lambda$2), and that the inner and outer radii of the annular transmitting portion I of the illuminating light beam limiting member 6 were determined according to the above-described conditions (inequalities) as follows:

$$r_i = 0.10 \geq \lambda 2/(2 \times P) = 0.750/24 = 0.031$$

$$r_o = 0.14$$

$$(r_o - r_i = 0.04 \leq \lambda 1/P = 0.550/12 = 0.046)$$

Further, the arrangement of the phase-contrast filter 160 was as shown in FIG. 15. The inner and outer radii of the phase difference imparting portion T were set equal to the inner and outer radii $r_i$ and $r_o$, respectively, of the annular transmitting portion I, and the numerical aperture $NA_o$ of the image-forming optical system was determined according to the above-described condition (inequality) as follows:

$$NA_o = 0.22 \geq \lambda 2/P + r_o = 0.750/12 + 0.14 = 0.203$$

Further, the transmittance of the phase difference imparting portion T was set at 1%. The refractive index of the dielectric film $T_1$ was 1.5, and the thickness thereof was set at 325 nm so that a phase difference of $\pi/2$ [rad] was given to the center wavelength 650 nm of illuminating light.

FIG. 16 shows the image intensity distribution for one period of the position detection mark 11. The position 0 on the abscissa axis represents the center of the mark (recess), and the chain line at each of the positions +P/4 and –P/4 represents an edge (boundary between recessed and projecting portions) of the mark. The intensity distribution plotted along the ordinate axis has been standardized so that the largest value of the image intensity in one period is 1.

Figure 17:
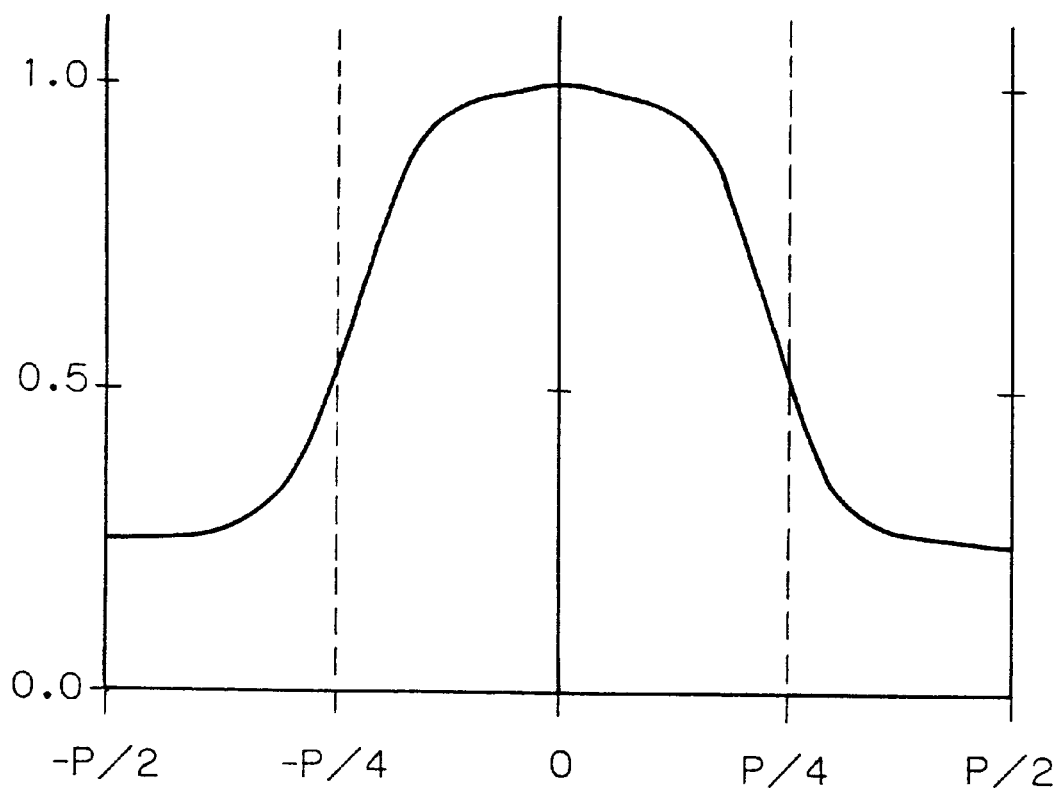
FIG. 17 shows a simulation result of an image of a position detection mark of low step, obtained under the same simulation conditions for the simulation result shown in FIG. 16 except the numerical aperture of an image-forming optical system.

FIG. 17 shows a result of a simulation performed under the same conditions as those for the simulation result shown in FIG. 16 except that the numerical aperture $NA_o$ was set at 0.18, that is, the system did not satisfy the above-described condition (24) for the numerical aperture $NA_o$. The mark image shown in FIG. 17 is slightly inferior to the image shown in FIG. 16 in the sharpness of the dark portions (i.e., the mark edge portions), but it has a sufficiently high contrast for detection of the edge position, that is, the mark position. Accordingly, it will be understood that it is not necessary to strictly satisfy the condition (24) for the numerical aperture $NA_o$ among the above-described conditions (22) to (24) in this embodiment.

Figure 18:
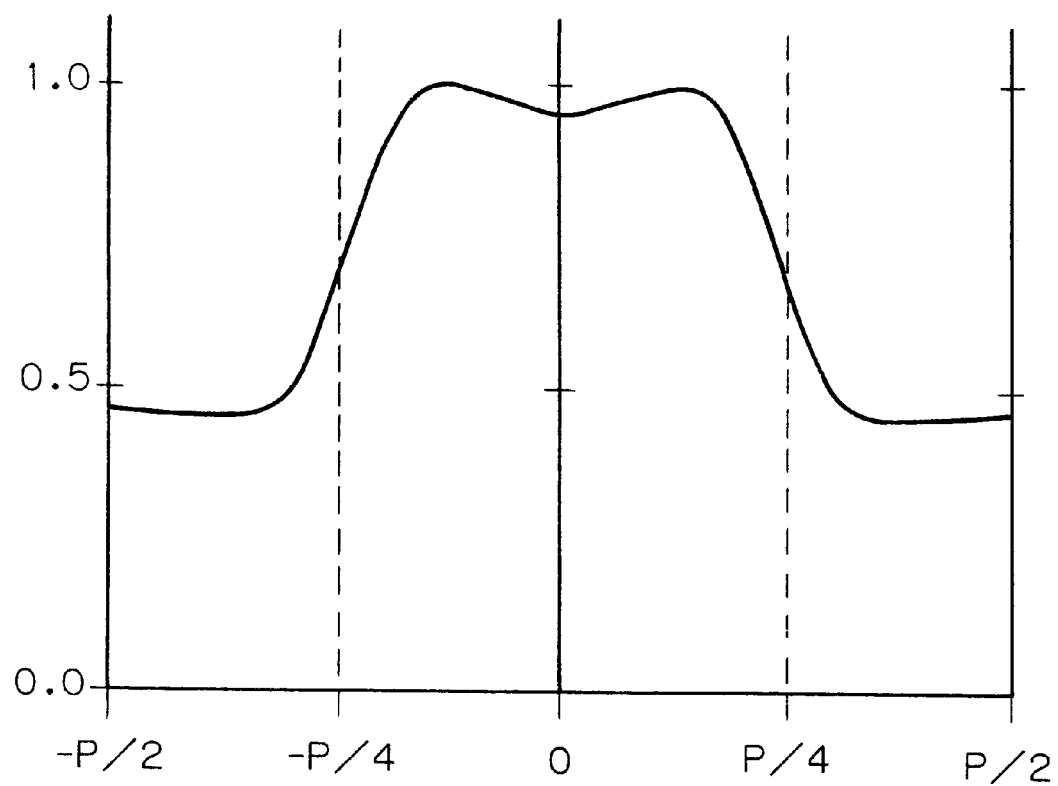
FIG. 18 shows a simulation result of an image of a position detection mark of low step, obtained under the same simulation conditions for the simulation result shown in FIG. 16 except the outer radius of an annular transmitting portion on an illumination system pupil plane.

FIG. 18 shows a result of a simulation performed under the same conditions as those for the simulation result shown in FIG. 16 except that the outer radius $r_o$ of the annular transmitting portion I was set at 0.18, that is, the system did not satisfy the above-described condition (22) for the outer radius $r_o$. In this case, the image contrast is markedly degraded in comparison to the images shown in FIGS. 16 and 17. Accordingly, it will be understood that no favorable detection accuracy can be obtained by position detection based on such an image.

Figure 19:
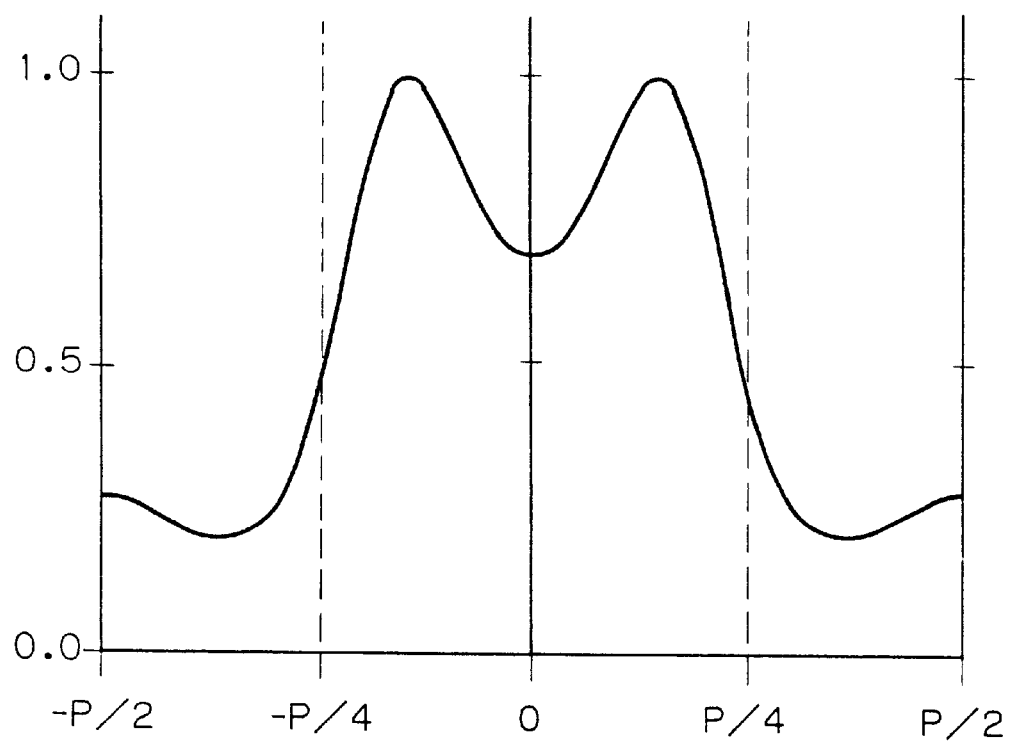
FIG. 19 shows a simulation result of an image of a position detection mark of low step, obtained under the same simulation conditions for the simulation result shown in FIG. 16 except the inner radius of the annular transmitting portion on the illuminance system pupil plane.

FIG. 19 shows a result of a simulation performed under the same conditions as those for the simulation result shown in FIG. 16 except that the inner radius $r_i$ and outer radius $r_o$ of the annular transmitting portion I were set at 0.02 and 0.06, respectively, that is, the system did not satisfy the above-described condition (23) for the inner radius $r_i$, although it satisfied the condition (22) for the outer radius $r_o$. In this case, the image contrast is high, but dark portions are formed not only at the mark edges but also at the center of the recess, although only a slight dark portion is observed at the center of the recess, thus causing the image fidelity to be degraded. Such an image may have an adverse effected on the position detection and is therefore difficult to use for position detection.

Figure 20:
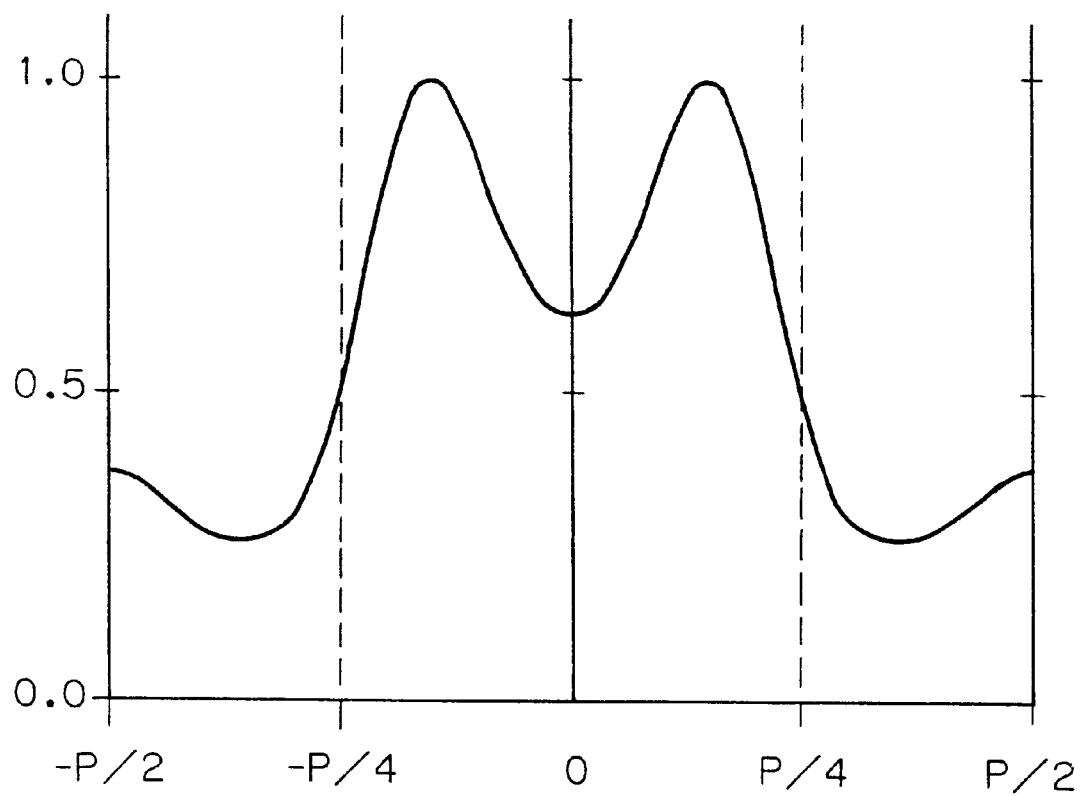
FIG. 20 shows a simulation result of an image of a position detection mark of low step, obtained when a transmitting portion on the illumination system pupil plane and a phase difference imparting portion on the image-forming system pupil plane are each formed as a circular portion.

FIG. 20 shows a result of a simulation performed under conditions different from those in FIGS. 16 to 19. That is, in the simulation shown in FIG. 20 the transmitting portion I of the illuminating light beam limiting member 6 was a circular portion (i.e., an ordinary $\sigma$ stop) centered at the optical axis, and the phase difference imparting portion T of the phase-contrast filter 160 was also a circular portion centered at the optical axis. It should be noted that both the radii of the transmitting portion I and phase difference imparting portion T were set at 0.66 (0.3 in terms of the $\sigma$ value). The wave band, numerical aperture and other conditions were the same as those for the simulation result shown in FIG. 16. The image obtained in this case has degraded fidelity in the same way as the image shown in FIG. 19 and is therefore difficult to use for position detection.

Figure 21:
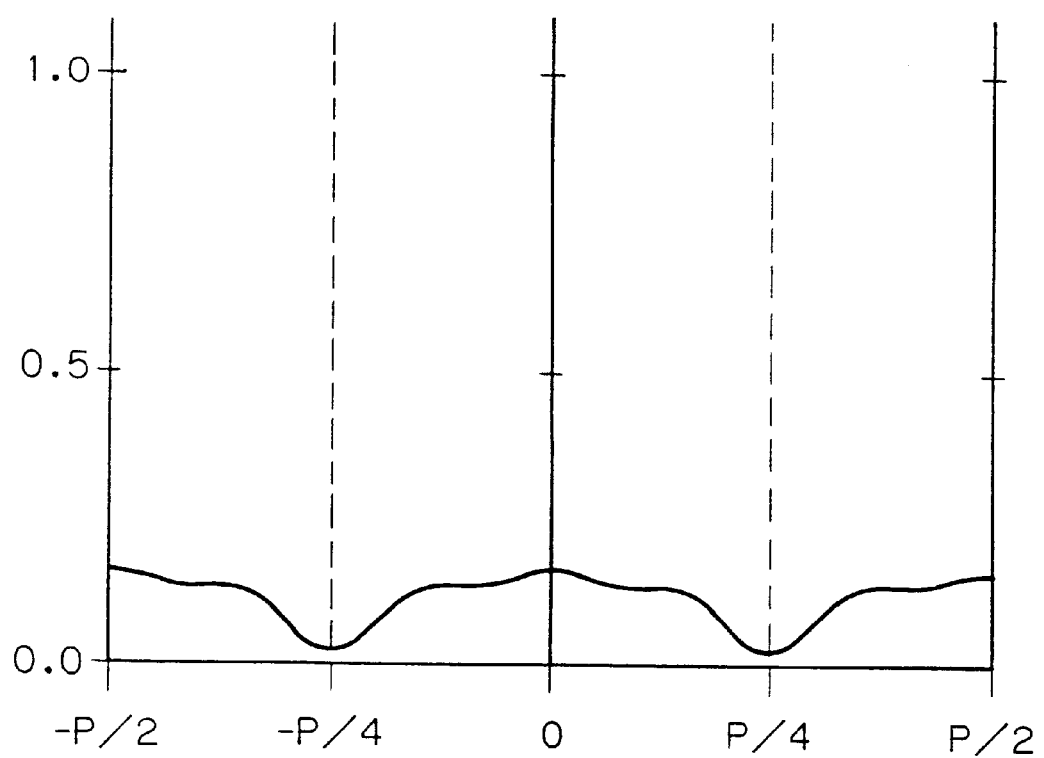
FIG. 21 shows a simulation result of an image of a position detection mark of low step, obtained with a dark-field microscope under the same simulation conditions for the simulation result shown in FIG. 16 except the transmittance of the phase difference imparting portion on the image-forming system pupil plane, the transmittance being 0%.

FIG. 21 comparatively shows a mark image obtained with a system in which the annular transmitting portion I of the illuminating light beam limiting member 6 and the phase difference imparting portion T of the phase-contrast filter 160 had the same shapes as shown in FIGS. 14(A) and 14(B), but the transmittance of the phase difference imparting portion T was 0% (i.e., the phase difference imparting portion T was a light-blocking portion). That is, FIG. 21 shows a mark image obtained with a dark-field microscope for comparative purposes. It should be noted that the scale of the ordinate axis in FIG. 21 is set to be the same as that in FIG. 16 for the purpose of facilitating the comparison. Even in the case of such a dark-field microscope, there is a difference between bright and dark (contrast) in an image of a position detection mark of low step. However, the intensity of the mark image is about ⅕ of the image intensity (FIG. 16) obtained by the position detecting apparatus according to the present invention. Accordingly, the mark image obtained with the dark-field microscope is dark, and hence the image signal output from the imaging device 28 has an unfavorable S/N ratio.

Figure 22:
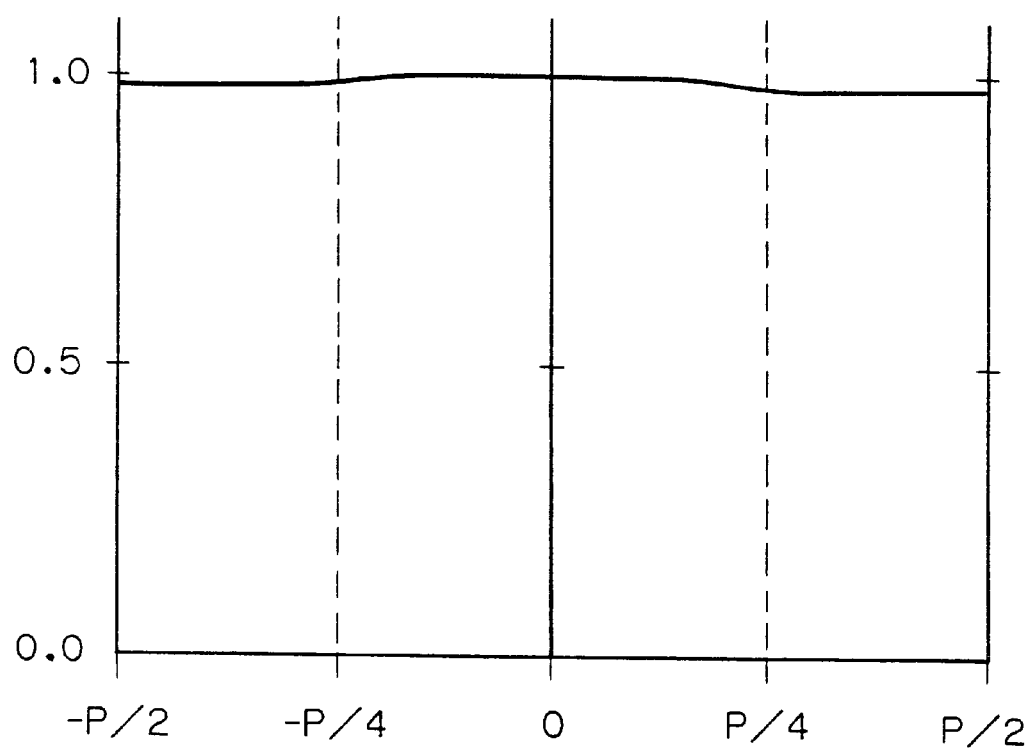
FIG. 22 shows a simulation result of an image of a position detection mark of low step, obtained with a bright-field microscope.

FIG. 22 shows an image obtained with an ordinary (bright-field) microscope. In this case, the radius of the $\sigma$ stop was 0.176 (0.8 in terms of the $\sigma$ value), and no phase difference imparting portion T was provided, as a matter of course. The other conditions were the same as those for the simulation result shown in FIG. 16. It will be clearly understood from FIG. 22 that, when a bright-field microscope is used for position detection of a mark having a low step height (5 nm), the obtained image has substantially no difference between bright and dark (contrast), and thus position detection cannot be effected.

Thus, in contrast to the images shown in FIGS. 18 to 22, the images shown in FIGS. 16 and 17, which are obtained by the position detecting apparatus according to this embodiment, have a sufficiently high contrast, and the bright and dark portions of the images coincide with the recessed and projecting portions of the mark. Accordingly, a reliable position detection can be effected by using such a mark image.

It should be noted that, in this embodiment also, when a mark of high step is to be detected, the illuminating light beam limiting member 6 and the phase-contrast filter 160 may be withdrawn from the optical path by using the changing mechanisms (movable members) 7 and 17, thereby switching the illumination mode to the ordinary illumination mode. When there is likelihood that the aberration condition of the optical system will be varied by withdrawal of the phase-contrast filter 160 (or the illuminating light beam limiting member 6) made of a glass substrate, it is necessary to insert a transparent member having an optical thickness equal to the thickness of the phase-contrast filter 160 (or the illuminating light beam limiting member 6) in place of it. This will be readily realized by arranging the changing mechanisms 7 and 17 so that the respective transparent members are retained by these mechanisms.

Figure 23:
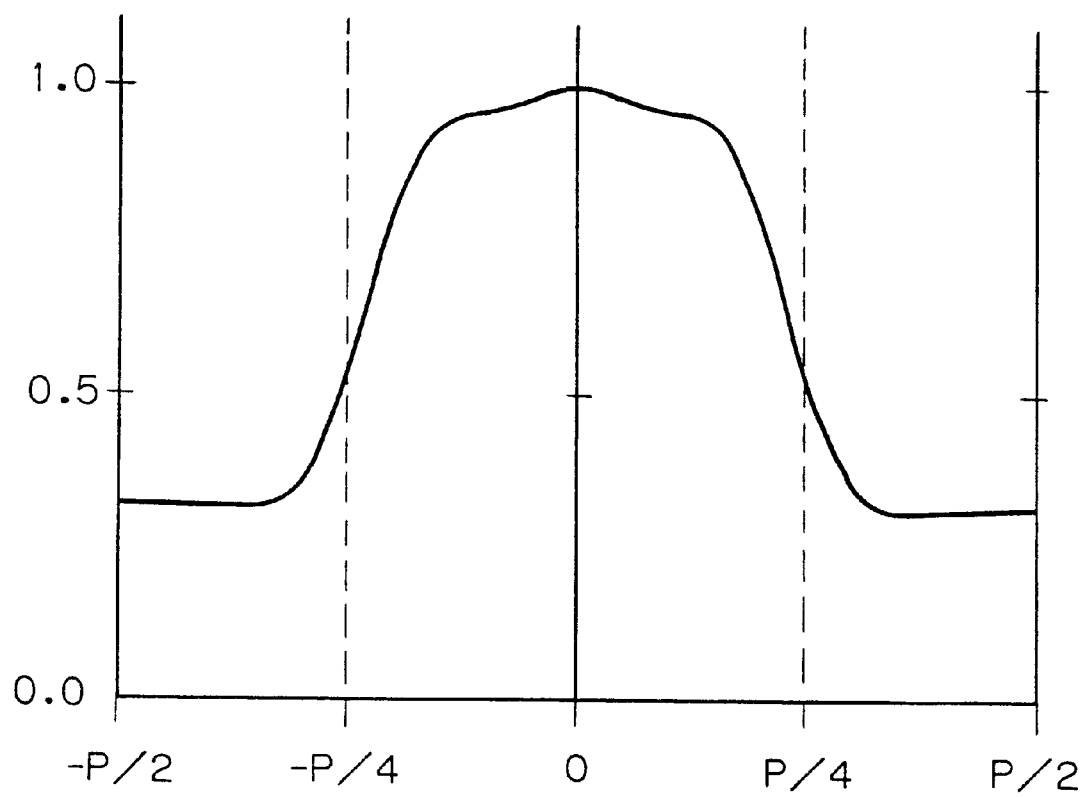
FIG. 23 shows a simulation result of an image of a position detection mark of low step, obtained when the transmittance of the phase difference imparting portion on the image-forming system pupil plane is 100%.

Although the above-described simulations were performed with respect to a position detection mark having a step height of 5 nm, for a mark having a step height which is not so low as 5 nm, e.g., a mark having a step height of the order of several tens of nanometers, it is possible to use a phase-contrast filter which gives a phase difference but does not reduce the light intensity, as well as a phase-contrast filter which reduces the light intensity and also gives a phase difference as shown in FIG. 15. FIG. 23 shows a result of a simulation in which a phase-contrast filter which gives a phase difference but does not reduce the light intensity was used for a position detection mark having a step height of 40 nm. It should be noted that the annular transmitting portion I of the illuminating light beam limiting member 6 and the phase difference imparting portion T of the phase-contrast filter 160 in this simulation had the same shapes as those for the simulation result shown in FIG. 16. As will be clear from FIG. 23, for a position detection mark having a step size which is large to a certain extent, an image of sufficiently high contrast can be obtained even if the transmittance of the phase difference imparting portion T is high (i.e., even if the light intensity is not greatly reduced).

Accordingly, the changing mechanism 17 may be arranged such that it retains both the phase-contrast filter 160, which is shown in FIG. 15, and a phase-contrast filter which performs only the addition of a phase difference (or a phase-contrast filter having a relatively high transmittance), and either of the two phase-contrast filters is interchangeably disposed in the image-forming optical path according to the step height of a position detection mark to be detected. It should be noted that, for a mark having a relatively low step height, a phase-contrast filter having a relatively low transmittance is selected and inserted into the image-forming optical path.

Figure 24:
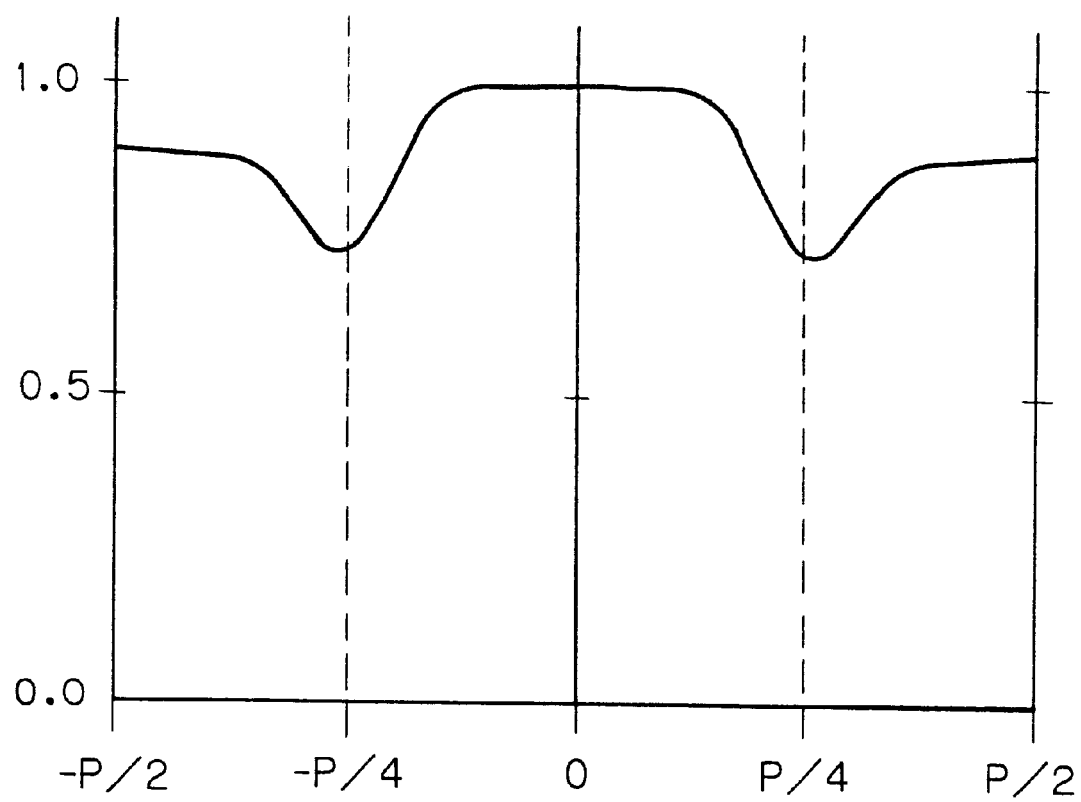
FIG. 24 shows a simulation result of an image of a position detection mark of relatively high step, obtained with a bright-field microscope.

FIG. 24 comparatively shows a result of a simulation in which a position detection mark having a step height of 40 nm was detected by using a bright-field microscope under the same conditions as those for FIG. 22. It will be clear from FIG. 24 that, even if the step height is 40 nm, a sufficiently high contrast cannot be obtained with a bright-field microscope. Thus, there is a distinct difference in contrast between the mark image shown in FIG. 23 obtained by the present invention and the mark image obtained by using a bright-field microscope.

Incidentally, in the above-described embodiment the inner and outer radii of an annular secondary light source formed by the illuminating light beam limiting member 6, that is, the annular transmitting portion I, and the inner and outer radii of the phase difference imparting portion T of the phase-contrast filter 160, which is conjugate to the annular transmitting portion I, together with the numerical aperture of the image-forming optical system, are determined by the wave band ($\lambda 1$ to $\lambda 2$) of the illuminating light beam. In this case, when a wavelength selecting device, e.g., a sharp-cut filter, is inserted between the position detection mark 11 and the imaging device 28, for example, or when the spectral sensitivity of the imaging device 28 is narrower than the wave band of the illuminating light beam, the inner and outer radii of the annular transmitting portion I, the inner and outer radii of the phase difference imparting portion T and the numerical aperture of the image-forming optical system should be determined by taking into consideration the above-described matters, that is, on the basis of a wave band which actually contributes to the formation of an image signal of the position detection mark 11.

Further, in this embodiment also, the illuminating light beam may be converged onto the annular area on the illumination system pupil plane to form a secondary light source by using, for example, an optical fiber bundle or a combination of a concave conical prism and a convex conical prism. In this case, the loss of light quantity is reduced to a considerable extent, advantageously.

Further, it is also possible to provide an optical integrator (e.g., a fly's-eye lens) on which light from the light source 1 is made incident to form a plurality of light source images on the illumination system pupil plane. In this case, the illuminance uniformity of illuminating light on the position detection mark 11 is improved to a considerable extent. It is, however, necessary in order to form an annular secondary light source on the illumination system pupil plane to dispose an aperture stop having an annular aperture (see FIG. 14(A)), for example, in the vicinity of the exit- or entrance-side surface of the fly's-eye lens. Further, in order to minimize the loss of light quantity, it is preferable that the intensity distribution of illuminating light over the entrance surface of the fly's-eye lens should be made higher in the annular area centered at the optical axis than in the other area by disposing a combination of concave and convex conical prisms or an optical fiber bundle having an annular exit end between the light source 1 and the fly's-eye lens, or by utilizing the aberration of an input lens disposed between the light source 1 and the fly's-eye lens.

Further, in this embodiment also, it is possible to provide a plurality of aperture stops which differ from each other in at least one of the outer and inner radii of the annular transmitting portion I, as has been described in the first embodiment. In this case, it is possible to select a most suitable aperture stop which satisfies the above-described conditions (22) and (23) in accordance with a change in the degree of fineness (period P) of the position detection mark 11 and to dispose the selected aperture stop in the illumination optical path. Accordingly, it is possible to obtain a mark image of high contrast at all times independently of the period of the position detection mark 11. Further, the arrangement may be such that the changing mechanism 7 is provided with a plurality of circular light-blocking plates having different diameters and a plurality of stop members ($\sigma$ stops) having different circular aperture diameters, and the inner radius of the annular transmitting portion I is defined by one of the circular light-blocking plates, and the outer radius thereof is defined by one of the $\sigma$ stops, whereby the radial width and/or position of the annular secondary light source (illuminating light beam distribution or light intensity distribution) on the illumination system pupil plane is changed by a combination of a circular light-blocking plate and a $\sigma$ stop. In this case, a zoom lens system may be disposed between the light source 1 and the changing mechanism 7, or a variable aperture stop (iris stop) may be disposed in close proximity to the circular light-blocking plate, instead of providing the changing mechanism 7 with a plurality of σ stops so that the illuminating light beam diameter (size), that is, the outer radius of the annular transmitting portion I, is changed as desired by the zoom lens system or the iris stop.

Further, in this embodiment also, the changing member 7 having a plurality of aperture stops may be replaced by an aperture stop which is formed, for example, by a liquid crystal device or an electrochromic device, and which is placed at the illumination system pupil plane, as has been described in the first embodiment.

It should be noted that, in this embodiment also, the outer and inner radii of the annular transmitting portion I (secondary light source) need not be changed in accordance with a change of the period of the position detection mark 11, and that the outer and/or inner radius of the annular transmitting portion I may be changed only when the image contrast or fidelity is degraded by a change of the period of the position detection mark 11 to such an extent that the desired position detection accuracy cannot be obtained.

Further, the area on the illumination system pupil plane other than the annular transmitting portion I need not completely be shielded from light, that is, the area other than the annular transmitting portion I may be formed as a light-reducing portion, provided that the desired position detection accuracy can be obtained even if the image contrast or fidelity is slightly degraded. The essential thing is to make the illuminating light (secondary light source) intensity distributed over the illumination system pupil plane higher in the annular region centered at the optical axis than in the other area. For example, the aberration of at least one lens system disposed between the light source 1 and the illumination system pupil plane, e.g., the relay lens 5 shown in FIG. 12, should be adjusted so that the light intensity distribution over the illumination system pupil plane is higher in the annular area than in the other area. In this case, the light intensity distribution over the illumination system pupil plane may be changed by interchangeably disposed in the illumination optical path one of a plurality of relay lenses which are different from each other in the aberration correction quantity.

In this embodiment also, it is possible to use a laser, e.g., a semiconductor laser, as the light source 1 for illumination in the same way as in the first embodiment. In this case also, it is desirable for the illuminating light beam to have a certain wave band, and it is therefore preferable to use a laser which oscillates at a multiplicity of wavelengths, e.g., a dye laser, or to use a plurality of lasers which oscillate at different wavelengths.

Although in this embodiment the phase-contrast filter 160 has a member (metal thin film $T_0$) for reducing the intensity of an image-forming light beam (zeroth-order diffracted light), which is integrally formed on the phase difference imparting portion T, the arrangement may be such that a transparent substrate having an annular metal thin film (light-reducing portion) is disposed in close proximity to the phase-contrast filter 160 or placed at a plane approximately conjugate to the phase-contrast filter 160 (i.e., pupil conjugate plane).

Further, the arrangement may be such that at least one of the outer and inner radii of the phase difference imparting portion T on the image-forming system pupil plane is changed in accordance with a change of at least one of the outer and inner radii of the annular transmitting portion I on the illumination system pupil plane. For example, the arrangement may be such that the changing mechanism 17 is provided with a plurality of phase-contrast filters which differ from each other in at least one of the outer and inner radii of the phase difference imparting portion T, that is, which differ from each other in at least either the radial width (annular ratio) or position of the phase difference imparting portion T, and one of the phase-contrast filters is interchangeably disposed in the image-forming optical path. In this case, even when at least one of the outer and inner radii of the annular transmitting portion I changes in accordance with the period of the position detection mark 11, as described above, it is possible to select a phase-contrast filter most suitable for the annular transmitting portion I after the change of its outer and/or inner radius and to dispose the selected phase-contrast filter in the image-forming optical path. Accordingly, it is possible to enable the light-forming light beam to enter the imaging device 28 while giving a phase difference to only the zeroth-order diffracted light at all times. It should be noted that the width and position of the phase difference imparting portion T on the image-forming system pupil plane need not be changed in accordance with a change of the outer and/or inner radius of the annular transmitting portion I on the illumination system pupil plane, and that the masking width and/or position of the phase difference imparting portion T may be changed only when the image contrast or fidelity is degraded by a change of the outer and/or inner radius of the annular transmitting portion I to such an extent that the desired position detection accuracy cannot be obtained.

The arrangement may also be such that the changing mechanism 17 is provided with a plurality of circular transparent plates which are approximately equal to each other in the optical thickness but have different diameters in place of a plurality of phase-contrast filters having phase difference imparting portions which are different from each other in the outer radius and/or inner radius, as described above, so that the circular transparent plates can be selectively and interchangeably disposed in the image-forming optical path. However, when the outer radius of the annular transmitting portion I on the illumination system pupil plane is changed, it is impossible to give a phase difference between the image-forming light beam in the annular area, which is in image-forming relation to the changed annular transmitting portion, and the image-forming light beam outside the annular area; however, no problem will arise unless the image contrast or fidelity is degraded to such an extent that the desired position detection accuracy cannot be obtained by the change in the outer radius of the annular transmitting portion I. It should be noted that, if the degradation of the image contrast or fidelity causes a problem, at least a part of the image-forming light beam distributed outside the annular area should preferably be blocked by the aperture stop 26, for example. In this case, it is desirable to change the aperture diameter of the aperture stop 26 within a range in which the above-described inequality (24) is substantially satisfied (i.e., within a range in which there is no problem in practical use due to the degradation of the image contrast or fidelity caused by a change of the numerical aperture $NA_o$ of the image-forming optical system).

In this embodiment also, both the annular transmitting portion I and the phase difference imparting portion T may have another shape, for example, a rectangular, square or polygonal (particularly, regular polygonal) shape. Further, the annular transmitting portion I on the illumination system pupil plane may be partially shielded (or formed as a light-reducing portion). That is, the annular transmitting portion I may comprise a plurality of partial light-transmitting portions (having any desired shape, e.g., a circular-arc shape, a circular shape, or a straight-line shape). Correspondingly, the phase difference imparting portion T on the image-forming system pupil plane may be formed in the same shape as the annular transmitting portion I. Alternatively, the phase difference imparting portion T may be formed in the shape of an annular ring, a rectangle, a polygon, etc. substantially containing a plurality of partial areas which are in image-forming relation to the partial light-transmitting portions. It should be noted that, in a case where the annular transmitting portion I on the illumination system pupil plane is square, each value should be determined so as to satisfy the conditions (22) and (23) in the same way as in the first embodiment.

Although in this embodiment the present invention has been described on the assumption that it is applied to an apparatus for detecting the position of a mark on a semiconductor substrate, it should be noted that the present invention is applicable not only to various apparatuses used in photolithography processes (i.e., exposure apparatuses) but also to optical apparatuses for other use applications. For example, if the present invention is applied to ordinary optical microscopes used for visual inspection or observation, it is possible to obtain an image of high contrast with respect to a low-step pattern in the same way as in the foregoing embodiments. The present invention is also applicable to microscopes which use transmission illumination, such as biological microscopes. In this case also, it is possible to obtain the same advantageous effects as those described above.

Thus, the present invention makes it possible to obtain a mark image of sufficiently high contrast even for a position detection mark with a step height reduced to an extremely small value by a planarization process or the like. Accordingly, the mark position can be detected with high accuracy by using the image intensity distribution of high contrast.

Further, it is possible to realize an optical apparatus (e.g., an optical microscope) whereby images of various patterns which have a small surface step or which cause a small change in phase of a light beam can be detected with higher contrast than by the conventional apparatuses.

What is claimed is:

1. A method of transferring a pattern onto an object comprising:

moving a stage on which said object is carried so that a mark on said object is substantially positioned in a focus plane of a mark detection system;

illuminating said mark with an illuminating light which passes through a first area on a first plane, said first plane being substantially in optical Fourier transform relation to said focus plane in said mark detection system;

detecting light generated from said mark by an imaging device of said mark detection system wherein an arrival to said imaging device of light distributed in a second area is substantially blocked or a phase of said light distributed in said second area is different from that of light distributed in an area which is different from said second area, said second area being substantially in image-forming relation to said first area and being on a second plane which is substantially in optical Fourier transform relation to said focus plane in said mark detection system; and moving said stage on the basis of said position information of said mark and an output of an interferometer for said stage, said position information being determined from an output signal of said imaging device.

2. A method according to claim 1, wherein at least one of dimensions and a shape of said first area is changed in accordance with a difference in height of a step of said mark or fineness of said mark.

3. A method according to claim 1, wherein said position information includes relative positional relationship between said mark and an index mark positioned in said mark detection system.

4. A method according to claim 3, wherein said index mark is illuminated by a beam of light which is different from light generated from said object by illumination of said illuminating light so that brightness of an image of said mark is the same as brightness of an image of said index mark in accordance with the change of at least one of the dimensions and the shape of said first area.

5. A method according to claim 1, wherein a light-blocking plate or a phase plate is substantially disposed on said second plane and an optical plate is substantially disposed on said second plane, optical thickness of said optical plate being about the same as that of said light-blocking plate or said phase plate by the exchange of the light-blocking plate or the phase plate.

6. A method according to claim 1, wherein said first area is defined as an annular area which has a center substantially corresponding to an optical axis of said mark detection system and wherein an outer radius $r_o$ and an inner radius $r_i$ of said first area satisfy the following conditions:

$$r_1 \geq \lambda_2/2P$$

$$r_0 - r_1 \leq \lambda_1/P$$

where $\lambda_1$ is the shortest wavelength of said illuminating light, $\lambda_2$ is the longest wavelength of said illuminating light, and P is a period of said mark.

7. A method according to claim 6, wherein a numeral aperture $NA_0$ of an objective optical system through which the light generated from said mark passes and is in said mark detection system satisfies the following condition:

$$NA_0 \geq r_0 + \lambda_2/P.$$

8. A method of transferring a pattern onto an object comprising:

moving a stage on which said object is carried so that a mark on said object is substantially positioned in a focus plane of a mark detection system;

illuminating said mark with an illuminating light which passes through an annular area on a predetermined plane, said predetermined plane being substantially in optical Fourier transform relation to said focus plane in said mark detection system, wherein an outer radius $r_0$ and an inner radius $r_1$ of said annular area satisfy the following conditions:

$$r_1 \geq \lambda_2/2P$$

$$r_0 - r_1 \leq \lambda_1/P$$

where $\lambda_1$ is the shortest wavelength of said illuminating light, $\lambda_2$ is the longest wavelength of said illuminating light, and P is a period of said mark;

detecting light generated from said mark by an imaging device of said mark detection system; and moving said stage on the basis of position information of said mark and an output of an interferometer for said stage, said position information being determined from an output signal of said imaging device.

9. A method according to claim 8, wherein a numeral aperture $NA_0$ of an objective optical system through which the light generated from said mark passes and is in said mark detection system satisfies the following condition:

$$NA_0 \geq r_0 + \lambda_2/P.$$

10. A method of transferring a pattern onto an object comprising:

moving a stage on which said object is carried so that a mark on said object is substantially positioned in a focus plane of a mark detection system;

illuminating said mark with an illuminating light which passes through an annular area on a predetermined plane, said predetermined plane being substantially in optical Fourier transform relation to said focus plane in said mark detection system;

detecting light generated from said mark by an imaging device through an objective optical system in said mark detection system, wherein a numeral aperture $NA_0$ of said objective optical system satisfies the following condition:

$$NA_0 \geq r_0 + \lambda_2/P$$

where $\lambda_2$ is the longest wavelength of said illuminating light, P is a period of said mark and an outer radius of said annular area is $r_0$; and moving said stage on the basis of position information of said mark and an output of an interferometer for said stage, said position information being determined from an output signal of said imaging device.

\* \* \* \* \*

UNITED STATES PATENT AND TRADEMARK OFFICE
CERTIFICATE OF CORRECTION

PATENT NO.    : 6,421,123 B1
DATED         : July 16, 2002
INVENTOR(S)   : Sato et al.

It is certified that error appears in the above-identified patent and that said Letters Patent is hereby corrected as shown below:

<u>Title page,</u>
Item [30], Foreign Application Priority Data, change "Feb 6, 1995" to -- June 2, 1995 --

Signed and Sealed this

Twenty-eighth Day of January, 2003

JAMES E. ROGAN
*Director of the United States Patent and Trademark Office*